US012696642B2

(12) United States Patent
Ko et al.

(10) Patent No.:  US 12,696,642 B2
(45) Date of Patent:      Jul. 28, 2026

(54) DISPLAY PANEL

(71) Applicant: SAMSUNG DISPLAY CO., LTD.,
Yongin-si (KR)

(72) Inventors: Seungcheol Ko, Yongin-si (KR);
Yongjun Park, Yongin-si (KR)

(73) Assignee: SAMSUNG DISPLAY CO., LTD.,
Yongin-si (KR)

( * ) Notice: Subject to any disclaimer, the term of this
patent is extended or adjusted under 35
U.S.C. 154(b) by 473 days.

(21) Appl. No.: 18/382,084

(22) Filed: Oct. 20, 2023

(65) Prior Publication Data

US 2024/0306449 A1      Sep. 12, 2024

(30) Foreign Application Priority Data

Mar. 9, 2023      (KR) ........................ 10-2023-0031360

(51) Int. Cl.
H10K 59/131          (2023.01)
H10K 59/121          (2023.01)
H10K 59/80           (2023.01)

(52) U.S. Cl.
CPC ....... H10K 59/131 (2023.02); H10K 59/1213
(2023.02); H10K 59/873 (2023.02)

(58) Field of Classification Search
CPC ............. H10K 59/131; H10K 59/1213; H10K
59/873; H10K 50/844; H10K 59/124;
H10K 59/65; H10K 59/8731; H10K
59/12; H10K 50/84; H10K 59/122; H10K
59/87; H10K 59/123; H10K 59/8051;
H10K 59/8052; H10K 59/88
See application file for complete search history.

(56) References Cited

U.S. PATENT DOCUMENTS

| | | | |
|---|---|---|---|
| 10,553,819 B2 | 2/2020 | Kim et al. | |
| 11,631,831 B2 | 4/2023 | Choi | |
| 2019/0245159 A1* | 8/2019 | Kim ..................... | H10K 59/122 |
| 2020/0235180 A1* | 7/2020 | Park ..................... | H10K 59/124 |
| 2020/0287164 A1* | 9/2020 | Choi ..................... | H10K 59/87 |
| 2022/0069021 A1 | 3/2022 | Kim et al. | |
| 2022/0209187 A1* | 6/2022 | Bok ..................... | H10K 59/131 |

FOREIGN PATENT DOCUMENTS

| | | |
|---|---|---|
| KR | 10-2203105 | 1/2021 |
| KR | 10-2021-0087610 | 7/2021 |
| KR | 10-2022-0030433 | 3/2022 |
| KR | 10-2022-0097671 | 7/2022 |

* cited by examiner

*Primary Examiner* — Syed I Gheyas
(74) *Attorney, Agent, or Firm* — F. CHAU &
ASSOCIATES, LLC

(57) ABSTRACT

A display panel includes a substrate comprising an opening.
A plurality of light-emitting diodes is arranged in a display
area surrounding the opening. A plurality of grooves is
located in a middle area between the opening and the display
area and disposed on at least one inorganic insulating layer
on the substrate. At least one groove of the plurality of
grooves includes a tip protruding towards a center of the at
least one groove. The tip includes a transparent layer and a
metal pattern layer disposed on the transparent layer. The
metal pattern layer includes a groove portion corresponding
to an edge of the tip. The groove portion exposes at least a
portion of an upper surface of the transparent layer.

20 Claims, 16 Drawing Sheets

FIG. 6

DISPLAY PANEL

CROSS-REFERENCE TO RELATED APPLICATION

This application claims priority under 35 U.S.C. § 119 to Korean Patent Application No. 10-2023-0031360, filed on Mar. 9, 2023 in the Korean Intellectual Property Office, the disclosure of which is incorporated by reference in its entirety herein.

1. TECHNICAL FIELD

One or more embodiments of the present disclosure relate to a display panel having an opening area inside a display area.

2. DISCUSSION OF RELATED ART

The usage of display apparatuses has diversified along with the advancement of the information society. In addition, as display apparatuses have become thinner and lighter, the range of use of the display apparatuses have extended.

As the area occupied by a display area in a display apparatus has increased, various functions connected or linked to the display apparatus have been added. Research has been conducted concerning a display apparatus in which various components may be arranged in the display area to increase the functionality of the display device and provide an increased area occupied by a display area of the display device.

SUMMARY

One or more embodiments include a display panel having an opening area, in which various types of components may be arranged, inside a display area, and a display apparatus including the display panel. However, such an objective is only an example, and aspects of embodiments of the present disclosure are not limited thereto.

Additional aspects will be set forth in part in the description which follows and, in part, will be apparent from the description, or may be learned by practice of the described embodiments of the disclosure.

According to an embodiment, a display panel includes a substrate comprising an opening. A plurality of light-emitting diodes is arranged in a display area surrounding the opening. A plurality of grooves is located in a middle area between the opening and the display area and disposed on at least one inorganic insulating layer on the substrate. At least one groove of the plurality of grooves includes a tip protruding towards a center of the at least one groove. The tip includes a transparent layer and a metal pattern layer disposed on the transparent layer. The metal pattern layer includes a groove portion corresponding to an edge of the tip. The groove portion exposes at least a portion of an upper surface of the transparent layer.

In an embodiment, the groove portion may have a quadrangular shape in a plan view.

In an embodiment, the metal pattern layer includes a plurality of groove portions. The plurality of groove portions may be arranged at regular intervals along the edge of the tip.

In an embodiment, the tip overlaps an opening of an organic insulating layer. An edge of the opening of the organic insulating layer may be visible through the groove portion.

In an embodiment, the display panel includes a lower layer comprising an oxide-based semiconductor material. A bottom surface of the at least one groove may be an upper surface of the lower layer.

In an embodiment, the transparent layer may include an oxide-based semiconductor material.

In an embodiment, a metal dummy stack may be arranged around the at least one groove. The metal pattern layer may be disposed on an organic insulating layer and may be in direct contact with the metal dummy stack through a hole included in the organic insulating layer.

In an embodiment, the metal dummy stack may include a plurality of metal layers that are stacked with at least one insulating layer therebetween.

In an embodiment, each of the plurality of light-emitting diodes may be connected to a sub-pixel circuit unit disposed on the substrate. The sub-pixel circuit comprises a first thin-film transistor including a silicon-based semiconductor layer and a second thin-film transistor including an oxide-based semiconductor layer.

In an embodiment, each of the plurality of light-emitting diodes may include an emission layer between a first electrode and a second electrode, and a functional layer between the first electrode and the second electrode, wherein the functional layer and the second electrode may be disconnected by the tip of the at least one groove in the middle area.

According to an embodiment of the present disclosure, a display panel includes a substrate including an opening. A plurality of light-emitting diodes is arranged in a display area surrounding the opening. An encapsulation layer is disposed on the plurality of light-emitting diodes. The encapsulation layer includes an organic encapsulation layer, a first inorganic encapsulation layer below the organic encapsulation layer, and a second inorganic encapsulation layer above the organic encapsulation layer. A plurality of grooves is located in a middle area between the opening and the display area and is disposed on at least one inorganic insulating layer on the substrate. A plurality of lower layers is arranged in the middle area and is respectively disposed below the plurality of grooves. At least one groove of the plurality of grooves includes a tip protruding towards a center of the at least one groove. The tip includes a transparent layer and a metal pattern layer disposed on the transparent layer. The metal pattern layer includes a groove portion corresponding to an edge of the tip. The groove portion exposes at least a portion of an upper surface of the transparent layer.

In an embodiment, each of the plurality of light-emitting diodes may be connected to a sub-pixel circuit unit disposed on the substrate. The sub-pixel circuit comprises a first thin-film transistor including a silicon-based semiconductor layer and a second thin-film transistor including an oxide-based semiconductor layer.

In an embodiment, each of the plurality of lower layers may include a same material as a material of the oxide-based semiconductor layer.

In an embodiment, the display panel may further include a first partition wall and a second partition wall located in the middle area and spaced apart from each other in a direction from the display area towards the opening.

In an embodiment at least one groove of the plurality of grooves may be located between the first partition wall and the second partition wall.

In an embodiment, the groove portion may have a quadrangular shape in a plan view.

In an embodiment, the metal pattern layer includes a plurality of groove portions. The plurality of groove portions may be arranged at regular intervals along the edge of the tip.

In an embodiment, the tip overlaps an opening of an organic insulating layer. An edge of the opening of the organic insulating layer may be visible through the groove portion.

In an embodiment, the transparent layer may include an oxide-based semiconductor material.

In an embodiment, a metal dummy stack may be arranged around the at least one groove. The metal pattern layer may be disposed on an organic insulating layer and may be in direct contact with the metal dummy stack through a hole included in the organic insulating layer.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 6 is a cross-sectional view, taken along line VI-VI' of FIG. 5, illustrating a display panel according to an embodiment;

DETAILED DESCRIPTION OF EMBODIMENTS

Figure 1:
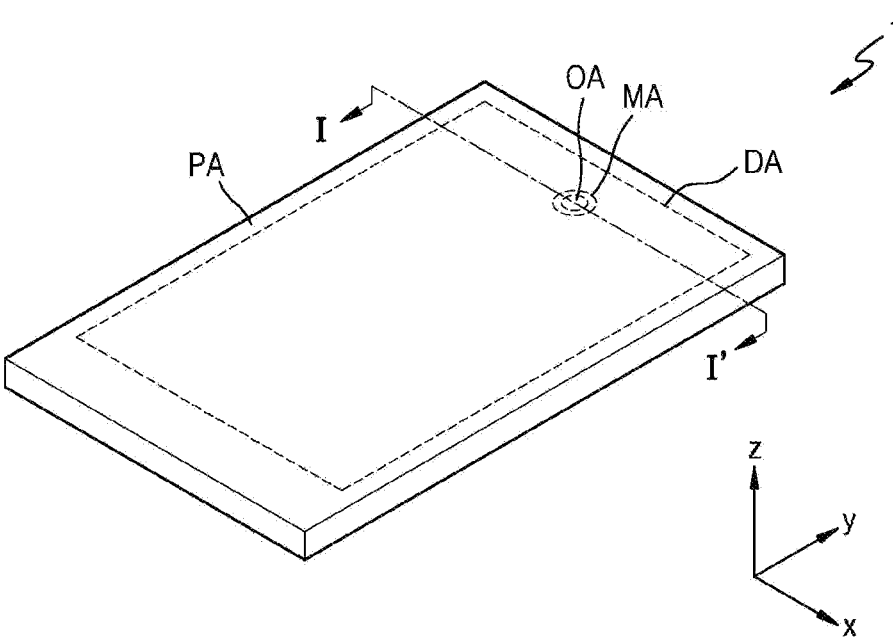
FIG. 1 is a perspective view schematically illustrating an electronic device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, non-limiting embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in the written description.

Effects and features of the disclosure, and methods for achieving them will be clarified with reference to embodiments described below in detail with reference to the drawings. However, embodiments of the present disclosure is not necessarily limited to the following embodiments and may be embodied in various forms.

Hereinafter, embodiments of the disclosure will be described in detail with reference to the accompanying drawings. When describing embodiments with reference to the drawings, the same or corresponding elements are denoted by the same reference numerals, and redundant descriptions thereof are omitted.

In the following embodiments, although the terms "first," "second," etc., may be used to describe various elements, such elements should not be limited to the above terms. The above terms are used to distinguish one element from another.

In the following embodiments, an expression used in the singular encompasses the expression of the plural, unless it has a clearly different meaning in the context.

In the following embodiments, terms such as "include" or "comprise" may be construed to denote a certain characteristic or element, or any combinations thereof, but may not be construed to exclude the existence of or a possibility of addition of one or more other characteristics, elements, or any combinations thereof.

In the following embodiments, when a layer, region, or element is referred to as being "on" another layer, region, or element, it can be directly or indirectly on the other layer, region, or element. For example, intervening layers, regions, or elements may be present. When a layer, region, or element is referred to as being "directly on" another layer, region, or element, no intervening layers, regions, or elements may be present.

Sizes of elements in the drawings may be exaggerated or reduced for convenience of description. For example, since sizes and thicknesses of elements in the drawings may be arbitrarily illustrated for convenience of description, embodiments of the present disclosure are not necessarily limited thereto.

When an embodiment may be implemented differently, a certain process order may be performed differently from the described order. For example, two processes described in succession may be performed substantially simultaneously, or may be performed in an order opposite to the order described.

As used herein, the expression "A and/or B" indicates only A, only B, or both A and B. In addition, the expression" at least one of A and B" indicates only A, only B, or both A and B.

In the following embodiments, when a layer, region, or element is referred to as being "connected" to another layer, region, or element, it may be "directly connected" to the other layer, region, or element, and/or may be "indirectly connected" to the other layer, region, or element with one or more intervening layers, regions, or elements therebetween. For example, when a layer, region, or element is referred to as being "electrically connected" to another layer, region, or element, it may be "directly electrically connected" to the other layer, region, or element, and/or may be "indirectly electrically connected" to the other layer, region, or element with one or more intervening layers, regions, or elements therebetween.

FIG. 1 is a perspective view schematically illustrating an electronic device 1 according to an embodiment.

Referring to FIG. 1, the electronic device 1 may be a device that displays at least one moving image and/or at least one still image, and may be used as a display screen of various products, such as televisions, laptop computers, monitors, billboards, and internet of things (IoT) devices, as well as portable electronic devices, such as mobile phones, smartphones, tablet personal computers (PCs), mobile communication terminals, electronic notebooks, electronic books, portable multimedia players (PMPs), navigation devices, and ultra-mobile PCs (UMPCs). In addition, the electronic device 1 according to an embodiment may be used in wearable devices, such as smart watches, watch phones, glasses-type displays, and head-mounted displays (HMDs). In addition, the electronic device 1 according to an embodiment may be used as instrument panels of automobiles, center information displays (CIDs) on center fascias or dashboards of automobiles, room mirror displays that replace side mirrors of automobiles, and displays arranged on rear surfaces of front seats to serve as entertainment for rear seats of automobiles. However, embodiments of the present disclosure are not necessarily limited thereto. For convenience of description, FIG. 1 illustrates that the electronic device 1 is used as a smartphone.

The electronic device 1 may have a rectangular shape in a plan view. For example, as illustrated in FIG. 1, the electronic device 1 may have a rectangular planar shape having a relatively short side in an x direction and a relatively long side in a y direction. However, embodiments of the present disclosure are not necessarily limited thereto. In an embodiment, an edge at which the relatively short side in the x direction and the relatively long side in the y direction meet each other may be round to have a certain curvature or may have a right angle. The planar shape of the electronic device 1 is not necessarily limited to a rectangle, and may have another polygonal shape, an elliptical shape, or an irregular shape in some embodiments.

The electronic device 1 may include an opening area OA (e.g., a first area) and a display area DA (e.g., a second area) surrounding at least the opening area OA. The electronic device 1 may include a middle area MA (e.g., a third area) located between the opening area OA and the display area DA, and a peripheral area PA (e.g., a fourth area) located outside the display area DA, for example, surrounding the display area DA. The middle area MA may have a closed loop shape entirely surrounding the opening area OA in a plan view.

The opening area OA may be located inside the display area DA. In an embodiment, as illustrated in FIG. 1, the opening area OA may be arranged in the upper center of the display area DA. Alternatively, the opening area OA may be variously arranged, for example, the opening area OA may be arranged on the upper left side of the display area DA, the upper right side of the display area DA, etc. Although FIG. 1 illustrates that one opening area OA is arranged, in some embodiments, a plurality of opening areas OA may be provided.

Figure 2:
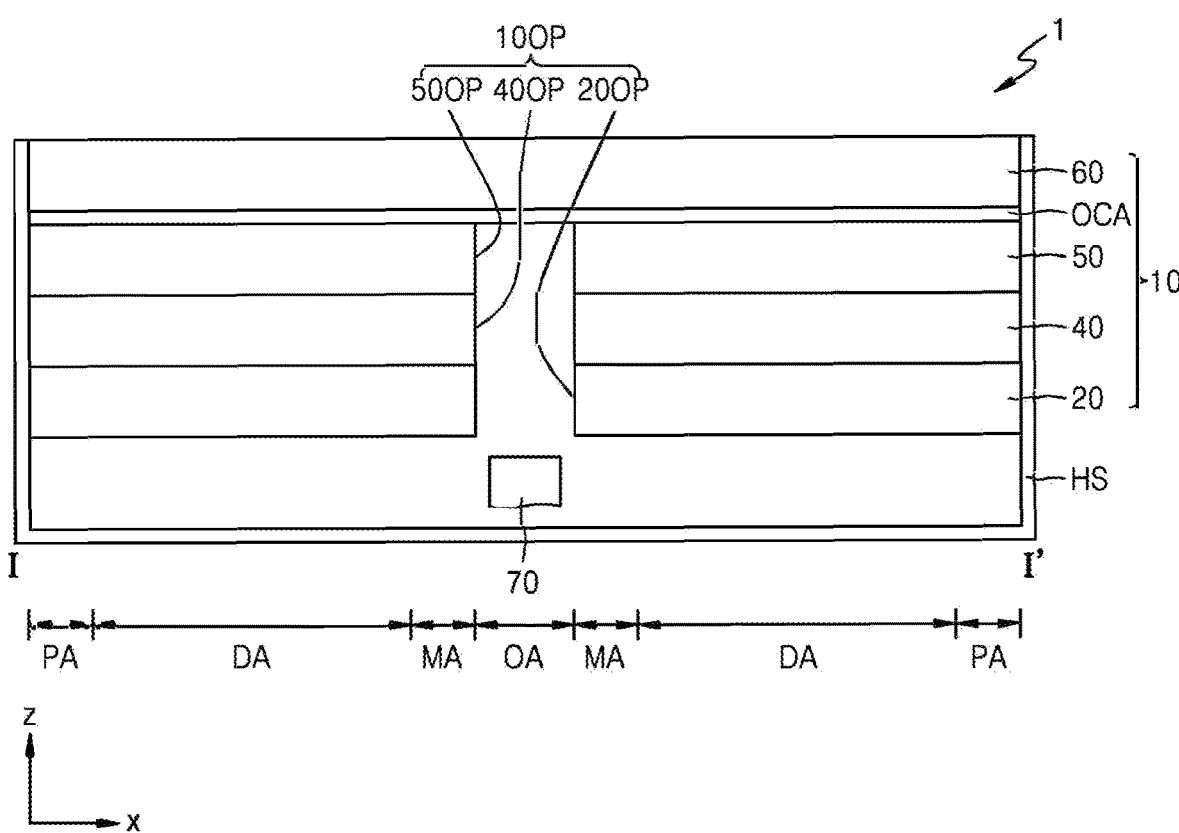
FIG. 2 is a cross-sectional view, taken along line I-I' of FIG. 1, schematically illustrating a display panel according to an embodiment.

FIG. 2 is a cross-sectional view schematically illustrating a display panel 10 according to an embodiment, taken along line I-I' of FIG. 1.

Referring to FIG. 2, the electronic device 1 may include the display panel 10 and a component 70 arranged in the opening area OA of the display panel 10. The display panel 10 and the component 70 may be accommodated in a housing HS.

In an embodiment, the display panel 10 may include an image generating layer 20, an input sensing layer 40, an optical functional layer 50, and a cover window 60.

The image generating layer 20 may include display elements (e.g., light-emitting elements) that emit light to display an image. The display elements may include a light-emitting diode, for example, an organic light-emitting diode including an organic emission layer. However, embodiments of the present disclosure are not necessarily limited thereto. For example, in an embodiment, the light-emitting diode may include an inorganic light-emitting diode including an inorganic material. The inorganic light-emitting diode may include a PN diode including inorganic semiconductor-based materials. When a voltage is applied to the PN junction diode in a forward direction, holes and electrons may be injected, and energy generated due to recombination of the holes and the electrons may be converted into light energy to emit light of a certain color. The inorganic light-emitting diode may have a width of several to several hundred micrometers or several to several hundred nanometers. In some embodiments, the image generating layer 20 may include a quantum dot light-emitting diode. For example, an emission layer of the image generating layer 20 may include an organic material, an inorganic material, quantum dots, an organic material and quantum dots, or an inorganic material and quantum dots.

The input sensing layer 40 may obtain coordinate information according to an external input, for example, a touch event. The input sensing layer 40 may include a sensing electrode (e.g., a touch electrode) and trace lines connected to the sensing electrode. The input sensing layer 40 may be disposed on the image generating layer 20 (e.g., in the z direction). The input sensing layer 40 may sense an external input by using a mutual-capacitive method and/or a self-capacitive method.

In an embodiment, the input sensing layer 40 may be formed directly on the image generating layer 20, or may be separately formed and then bonded to the image generating layer 20 through an adhesive layer such as an optical clear adhesive. For example, in an embodiment the input sensing layer 40 may be continuously formed after a process of forming the image generating layer 20, and in this embodiment, an adhesive layer may not be arranged between the input sensing layer 40 and the image generating layer 20. Although FIG. 2 illustrates that the input sensing layer 40 is arranged between the image generating layer 20 and the optical functional layer 50 (e.g., in the z direction), embodiments of the present disclosure are not necessarily limited thereto. For example, in an embodiment, the input sensing layer 40 may be disposed on the optical functional layer 50.

The optical functional layer 50 may include an anti-reflection layer. The anti-reflection layer may reduce the reflectance of light (e.g., external light) incident from the outside toward the display panel 10 through the cover window 60. In an embodiment, the anti-reflection layer may include a retarder and a polarizer. However, embodiments of the present disclosure are not necessarily limited thereto. For example, in an embodiment, the anti-reflection layer may include a black matrix and color filters. The color filters may be arranged to correspond to the color of light emitted from each of the light-emitting diodes of the image generating layer 20.

To increase the transmittance of the opening area OA, the display panel 10 may include an opening 10OP passing through some of the layers constituting the display panel 10. The opening 10OP may include first to third openings 20OP, 40OP, and 50OP respectively passing through the image generating layer 20, the input sensing layer 40, and the optical functional layer 50. The first opening 20OP of the image generating layer 20, the second opening 40OP of the input sensing layer 40, and the third opening 500P of the optical functional layer 50 may overlap each other (e.g., in the z direction) to form the opening 10OP of the display panel 10.

The cover window 60 may be disposed on the optical functional layer 50. In an embodiment, the cover window 60 may be bonded to the optical functional layer 50 through an adhesive layer such as an optical clear adhesive OCA therebetween. The cover window 60 may cover the first opening 20OP of the image generating layer 20, the second opening 40OP of the input sensing layer 40, and the third opening 50OP of the optical functional layer 50.

In an embodiment, the cover window 60 may include a glass material or a plastic material. The glass material may include ultra-thin glass. For example, the plastic material may include polyethersulfone, polyacrylate, polyetherimide, polyethylene naphthalate, polyethylene terephthalate, polyphenylene sulfide, polyarylate, polyimide, polycarbonate, or cellulose acetate propionate. However, embodiments of the present disclosure are not necessarily limited thereto.

The opening area OA may be a type of component area (e.g., a sensor area, a camera area, a speaker area, etc.) in which the component 70 for adding various functions to the electronic device 1 is located.

In an embodiment, the component 70 may include an electronic element. For example, in an embodiment the component 70 may include an electronic element using light or sound. For example, in some embodiments the electronic element may include a sensor such as an infrared sensor using light, a camera for receiving light to capture an image, a sensor for outputting and sensing light or sound to measure a distance or recognize a fingerprint or the like, a miniature lamp for outputting light, or a speaker for outputting sound. The electronic element using light may use light of various wavelength bands, such as visible light, infrared light, ultraviolet light, or the like. The opening area OA may correspond to an area through which light or/and sound output from the component 70 to the outside or traveling from the outside toward the electronic element may be transmitted.

Figure 3:
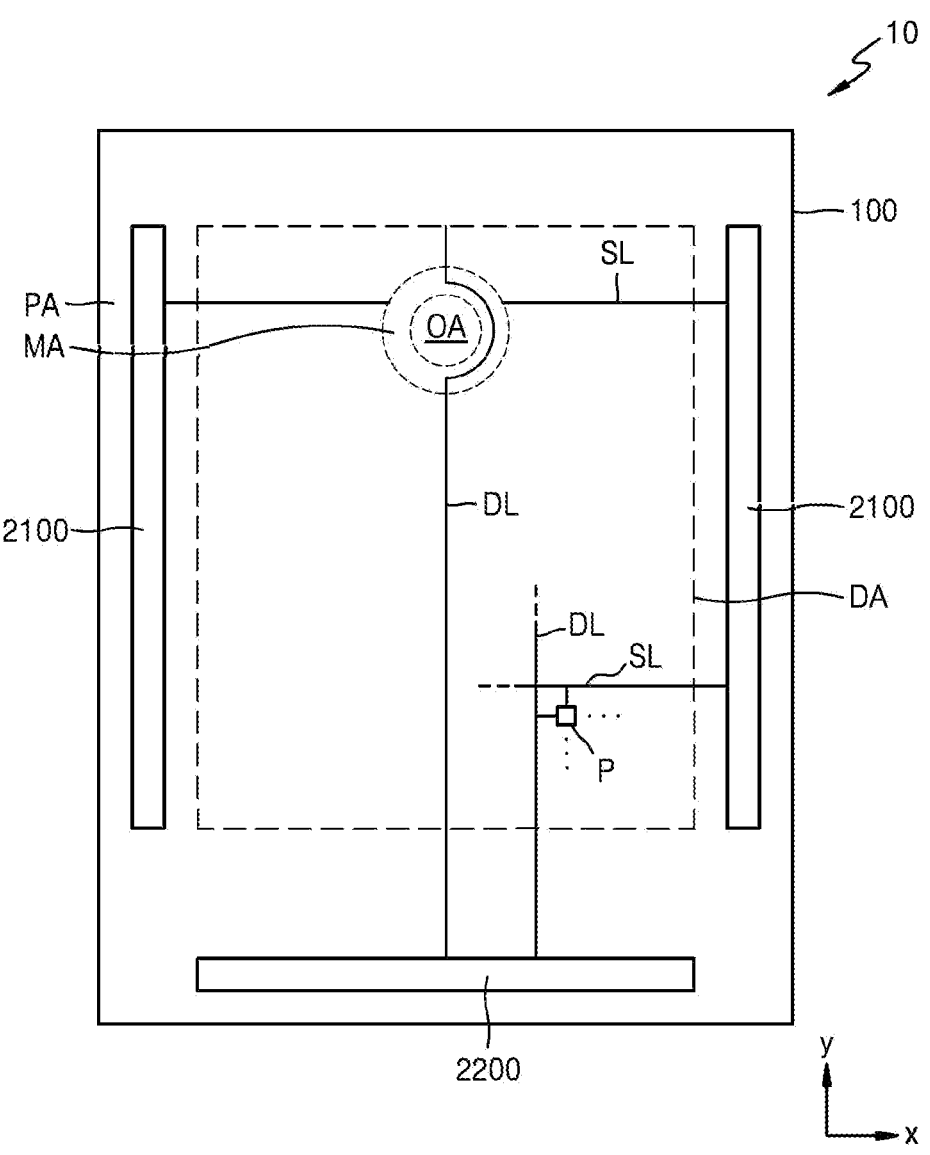
FIG. 3 is a plan view schematically illustrating a display panel according to an embodiment.

FIG. 3 is a plan view schematically illustrating the display panel 10 according to an embodiment.

Referring to FIG. 3, the display panel 10 may include the opening area OA, the display area DA, the middle area MA, and the peripheral area PA.

The display panel 10 may include a plurality of sub-pixels P in the display area DA, and the display panel 10 may display an image by using light emitted from each sub-pixel P. In an embodiment, each sub-pixel P may emit red, green, or blue light by using a light-emitting diode. The light-emitting diode of each sub-pixel P may be electrically connected to a scan line SL and a data line DL. However, embodiments of the present disclosure are not necessarily limited thereto and the color of the light emitted by each sub-pixel P may vary.

In the peripheral area PA, a scan driver 2100 for providing a scan signal to each sub-pixel P, a data driver 2200 for providing a data signal to each sub-pixel P, and a first main power line and a second main power line for respectively providing a first power voltage and a second power voltage may be arranged. In an embodiment, the scan driver 2100 may be arranged on each of opposite sides of the display area DA (e.g., in the x direction) with the display area DA therebetween. In this embodiment, the sub-pixel P on the left side of the opening area OA may be connected to the scan driver 2100 on the left side, and the sub-pixel P on the right side of the opening area OA may be connected to the scan driver 2100 on the right side.

The middle area MA may surround the opening area OA (e.g., in the x and y directions). The middle area MA may be an area in which a display element such as a light-emitting diode emitting light is not arranged, and signal lines for providing signals to the sub-pixels P around the opening area OA may pass through the middle area MA. For example, the data lines DL and/or the scan lines SL may cross the display area DA, and some of the data lines DL and/or the scan lines SL may detour in the middle area MA along an edge of the opening 10OP of the display panel 10, which is formed in the opening area OA. In an embodiment, FIG. 3 illustrates that the data lines DL cross the display area DA in the y direction, and some of the data lines DL detour so as to partially surround the opening area OA in the middle area MA. In an embodiment, the scan lines SL may cross the display area DA in the x direction, and may be spaced apart from each other in the y direction with the opening area OA therebetween.

Although FIG. 3 illustrates that the data driver 2200 is arranged adjacent to one side of a substrate 100 (e.g., a lower side in the y direction), embodiments of the present disclosure are not necessarily limited thereto. For example, in an embodiment, the data driver 2200 may be arranged on a printed circuit board electrically connected to a pad on one side of the display panel 10. The printed circuit board may be flexible, and a portion of the flexible printed circuit board may be bent so as to be located below a rear surface of the substrate 100.

Figure 4:
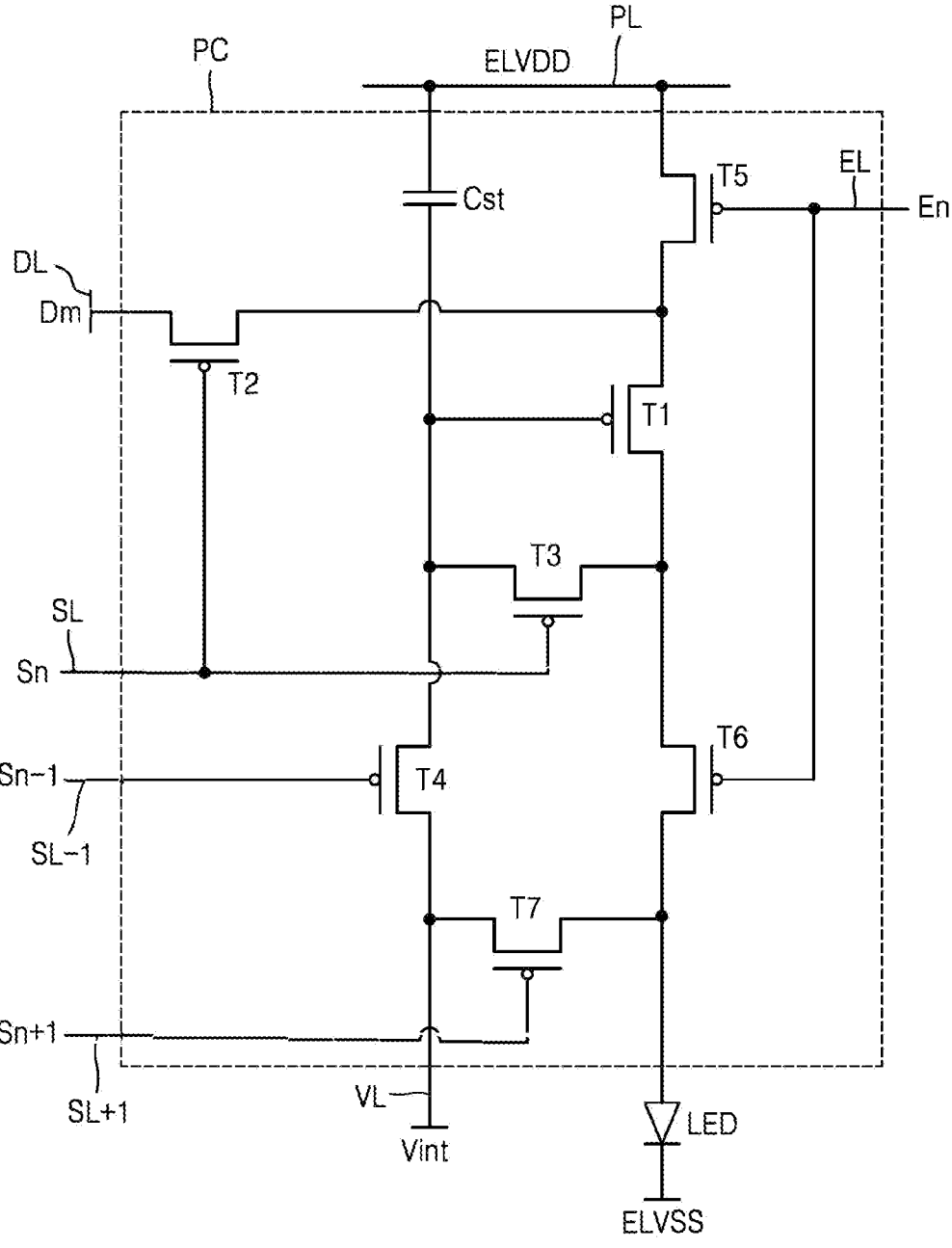
FIG. 4 is an equivalent circuit diagram schematically illustrating a light-emitting diode and a circuit connected to the light-emitting diode, according to an embodiment.

FIG. 4 is an equivalent circuit diagram schematically illustrating a light-emitting diode LED and a circuit connected to the light-emitting diode LED, according to an embodiment.

Referring to FIG. 4, the sub-pixel P described above with reference to FIG. 3 may emit light through the light-emitting diode LED, and the light-emitting diode LED may be electrically connected to a sub-pixel circuit PC.

In an embodiment, the sub-pixel circuit PC may include a first thin-film transistor T1, a second thin-film transistor T2, a third thin-film transistor T3, a fourth thin-film transistor T4, a fifth thin-film transistor T5, a sixth thin-film transistor T6, a seventh thin-film transistor T7, and a storage capacitor Cst.

In an embodiment, the second thin-film transistor T2 may be a switching thin-film transistor, may be connected to the scan line SL and the data line DL, and may be configured to transmit a data voltage (e.g., a data signal Dm) input through the data line DL to the first thin-film transistor T1, based on a scan signal Sn input through the scan line SL. The storage capacitor Cst may be connected to the second thin-film transistor T2 and a driving voltage line PL, and may store a voltage corresponding to a difference between a voltage received from the second thin-film transistor T2 and a driving voltage ELVDD supplied to the driving voltage line PL.

In an embodiment, the first thin-film transistor T1 may be a driving thin-film transistor, may be connected to the driving voltage line PL and the storage capacitor Cst, and may control a driving current flowing from the driving voltage line PL to the light-emitting diode LED, in response to a voltage value stored in the storage capacitor Cst. The light-emitting diode LED may emit light having a certain luminance according to the driving current. A second electrode (e.g., a cathode) of the light-emitting diode LED may receive a common voltage ELVSS.

In an embodiment, the third thin-film transistor T3 may be a compensation thin-film transistor, and a gate electrode of the third thin-film transistor T3 may be connected to the scan line SL. A source electrode (or a drain electrode) of the third thin-film transistor T3 may be connected to a drain electrode (or a source electrode) of the first thin-film transistor T1, and may be connected to a first electrode of the light-emitting diode LED through the sixth thin-film transistor T6. The drain electrode (or the source electrode) of the third thin-film transistor T3 may be connected to any one electrode of the storage capacitor Cst, a source electrode (or a drain electrode) of the fourth thin-film transistor T4, and a gate electrode of the first thin-film transistor T1. The third thin-film transistor T3 may be turned on according to the scan signal Sn received through the scan line SL, and may connect the gate electrode and the drain electrode of the first thin-film transistor T1 to each other, to diode-connect the first thin-film transistor T1.

In an embodiment, the fourth thin-film transistor T4 may be an initialization thin-film transistor, and a gate electrode of the fourth thin-film transistor T4 may be connected to a previous scan line SL-1. The drain electrode (or the source electrode) of the fourth thin-film transistor T4 may be connected to an initialization voltage line VL. The source electrode (or the drain electrode) of the fourth thin-film transistor T4 may be connected to any one electrode of the storage capacitor Cst, the drain electrode (or the source electrode) of the third thin-film transistor T3, and the gate electrode of the first thin-film transistor T1. The fourth thin-film transistor T4 may be turned on according to a previous scan signal Sn-1 received through the previous scan line SL-1, and may be configured to transmit an initialization voltage Vint to the gate electrode of the first thin-film transistor T1, to perform an initialization operation of initializing a voltage of the gate electrode of the first thin-film transistor T1.

In an embodiment, the fifth thin-film transistor T5 may be an operation control thin-film transistor, and a gate electrode of the fifth thin-film transistor T5 may be connected to an emission control line EL. A source electrode (or a drain electrode) of the fifth thin-film transistor T5 may be connected to the driving voltage line PL. The drain electrode (or the source electrode) of the fifth thin-film transistor T5 may be connected to the source electrode (or the drain electrode) of the first thin-film transistor T1 and a drain electrode (or a source electrode) of the second thin-film transistor T2.

In an embodiment, the sixth thin-film transistor T6 may be an emission control thin-film transistor, and a gate electrode of the sixth thin-film transistor T6 may be connected to the emission control line EL. A source electrode (or a drain electrode) of the sixth thin-film transistor T6 may be connected to the drain electrode (or the source electrode) of the first thin-film transistor T1 and the source electrode (or the drain electrode) of the third thin-film transistor T3. The drain electrode (or the source electrode) of the sixth thin-film transistor T6 may be electrically connected to the first electrode of the light-emitting diode LED. The fifth thin-film transistor T5 and the sixth thin-film transistor T6 may be simultaneously turned on according to an emission control signal En received through the emission control line EL, so that the driving voltage ELVDD may be transmitted to the light-emitting diode LED, and the driving current may flow through the light-emitting diode LED.

In an embodiment, the seventh thin-film transistor T7 may be an initialization thin-film transistor that initializes the first electrode of the light-emitting diode LED. A gate electrode of the seventh thin-film transistor T7 may be connected to a next scan line SL+1. A source electrode (or a drain electrode) of the seventh thin-film transistor T7 may be connected to the first electrode of the light-emitting diode LED.

The drain electrode (or the source electrode) of the seventh thin-film transistor T7 may be connected to the initialization voltage line VL. The seventh thin-film transistor T7 may be turned on according to a next scan signal Sn+1 received through the next scan line SL+1, and may initialize the first electrode of the light-emitting diode LED.

Although FIG. 4 illustrates an embodiment in which the fourth thin-film transistor T4 and the seventh thin-film transistor T7 are respectively connected to the previous scan line SL-1 and the next scan line SL+1, embodiments of the present disclosure are not necessarily limited thereto. For example, in an embodiment, both the fourth thin-film transistor T4 and the seventh thin-film transistor T7 may be connected to the previous scan line SL-1 and driven according to the previous scan signal Sn-1.

The other electrode of the storage capacitor Cst may be connected to the driving voltage line PL. Any one electrode of the storage capacitor Cst may be connected to the gate electrode of the first thin-film transistor T1, the drain electrode (or the source electrode) of the third thin-film transistor T3, and the source electrode (or the drain electrode) of the fourth thin-film transistor T4.

The second electrode (e.g., the cathode) of the light-emitting diode LED may receive the common voltage ELVSS. The light-emitting diode LED may receive the driving current from the first thin-film transistor T1 to emit light.

Figure 5:
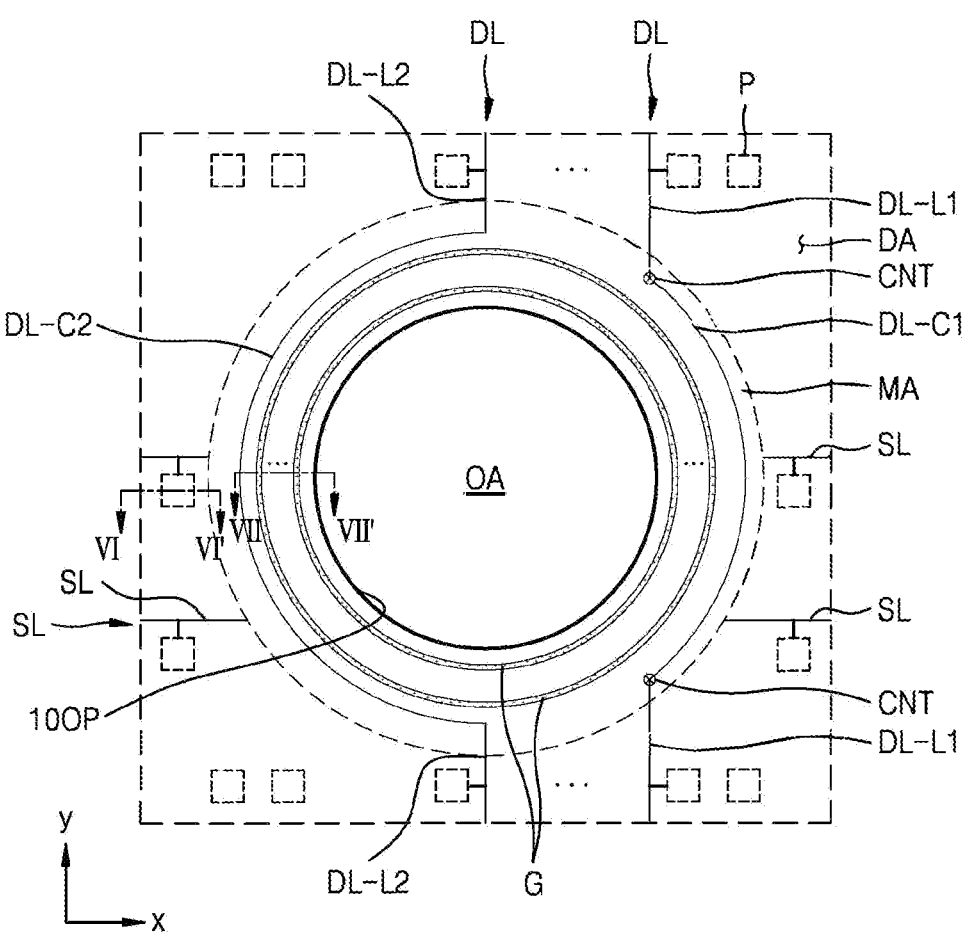
FIG. 5 is a plan view illustrating a portion of a display panel according to an embodiment.

FIG. 5 is a plan view illustrating a portion of the display panel 10 according to an embodiment.

Referring to FIG. 5, the sub-pixels P may be arranged in the display area DA. The middle area MA may be located between the opening area OA and the display area DA (e.g., in the x and y directions). The sub-pixels P adjacent to the opening area OA may be arranged to be spaced apart from each other around the opening area OA in a plan view. In the plan view of FIG. 5, the sub-pixels P may be arranged to be vertically spaced apart from each other (e.g., in the y direction) around the opening area OA, or may be arranged to be horizontally spaced apart from each other (e.g., in the x direction) around the opening area OA. As described above with reference to FIGS. 3 and 4, since in an embodiment each sub-pixel P uses red, green, or blue light emitted from a light-emitting diode, locations of the sub-pixels P illustrated in FIG. 4 correspond to locations of respective light-emitting diodes. Accordingly, the sub-pixels P are arranged to be spaced apart from each other around the opening area OA in a plan view may indicate that the light-emitting diodes are arranged to be spaced apart from each other around the opening area OA in a plan view. For example, in a plan view, the light-emitting diodes may be arranged to be vertically spaced apart from each other around the opening area OA, or may be arranged to be horizontally spaced apart from each other around the opening area OA.

Among signal lines through which a signal is supplied to a pixel circuit connected to the light-emitting diode of each sub-pixel P, signal lines adjacent to the opening area OA may detour the opening area OA and/or the opening 10OP. Among data lines passing through the display area DA, some data lines DL may extend in a ty direction such that data signals are provided to the sub-pixels P respectively disposed above and below the opening area OA (e.g., in the ty direction), and may detour along an edge of the opening area OA and/or the opening 10OP in the middle area MA.

A detour portion DL-C1 of at least one data line DL among the data lines DL may be formed on a different layer from an extension portion DL-L1 of the data line DL crossing the display area DA. In an embodiment, the detour portion DL-C1 and the extension portion DL-L1 of the data line DL may be connected to each other through a contact hole CNT. A detour portion DL-C2 of at least one data line DL among the data lines DL may be located on the same layer as, and may be integrally formed with, an extension portion DL-L2 of the data line DL.

The scan lines SL may be separated or disconnected around the opening area OA. For example, the scan line SL on the left side of the opening area OA may receive a signal from the scan driver 2100 on the left side of the display area DA as illustrated above with reference to FIG. 3, and the scan line SL on the right side of the opening area OA may receive a signal from the scan driver 2100 on the right side of the display area DA as illustrated in FIG. 3.

Grooves G may be disposed between the opening area OA and the area of the middle area MA in which the data lines DL detour. In a plan view, each of the grooves G may have a closed loop shape surrounding the opening area OA, and the grooves G may be spaced apart from each other.

Figure 6:
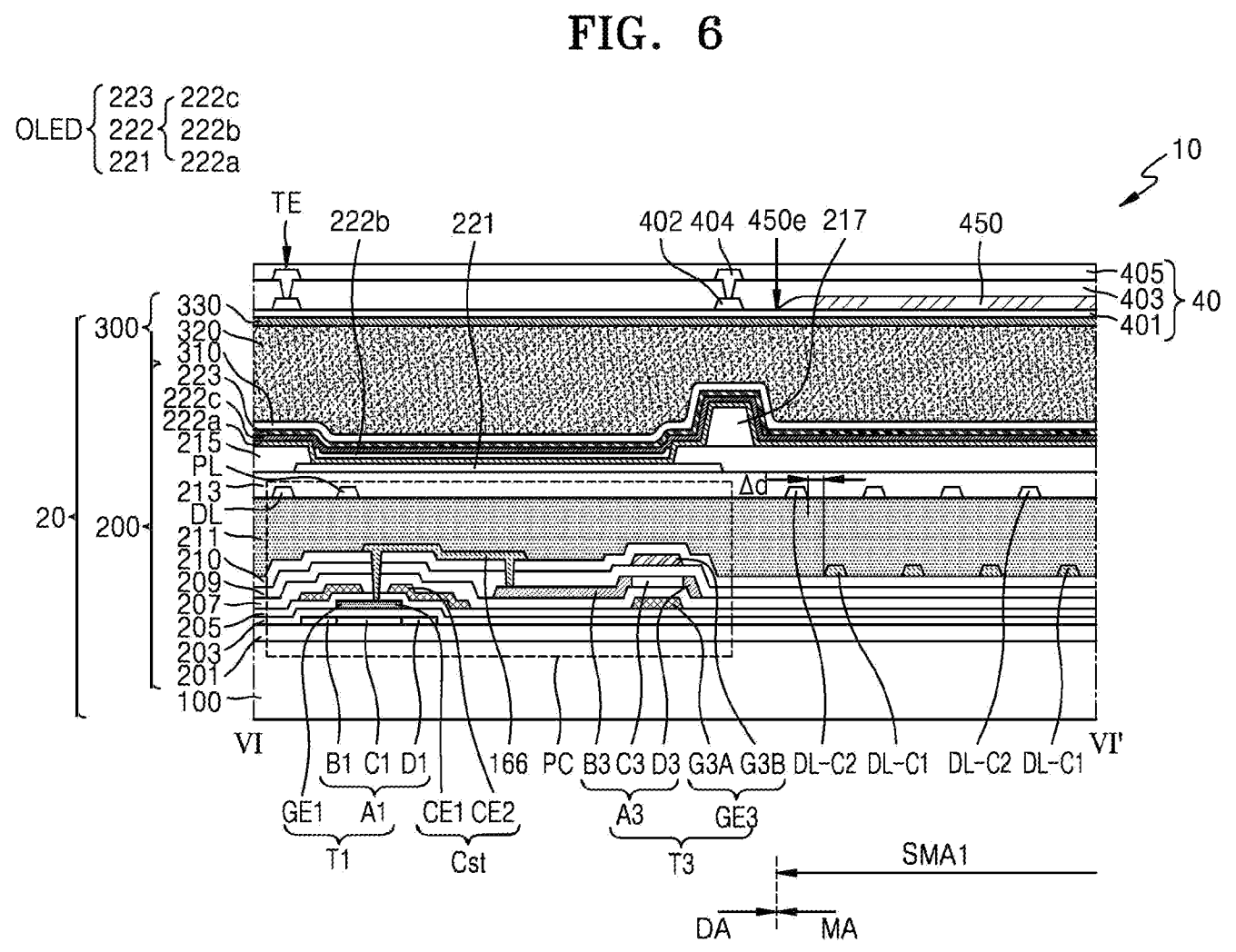

FIG. 6 is a cross-sectional view illustrating the display panel 10 according to an embodiment, taken along line VI-VI' of FIG. 5.

Referring to the display area DA of FIG. 6, the substrate 100 may include a glass material or a polymer resin. In an embodiment, the substrate 100 may have a structure in which a base layer including a polymer resin and a barrier layer including an inorganic insulating material such as silicon oxide or silicon nitride are alternately stacked. In an embodiment, the polymer resin may include a polymer resin such as polyethersulfone, polyarylate, polyetherimide, polyethylene naphthalate, polyethylene terephthalate, polyphenylene sulfide, polyimide, polycarbonate, cellulose triacetate, or cellulose acetate propionate. However, embodiments of the present disclosure are not necessarily limited thereto.

The sub-pixel circuit PC (e.g., a sub-pixel circuit unit) may be formed on the substrate 100, and a light-emitting diode, for example, an organic light-emitting diode OLED, may be disposed on the sub-pixel circuit PC.

In an embodiment, before the sub-pixel circuit PC is formed, a buffer layer 201 may be formed on the substrate 100 to prevent impurities from permeating into the sub-pixel circuit PC. In an embodiment, the buffer layer 201 may include an inorganic insulating material such as silicon nitride, silicon oxynitride, and silicon oxide, and may include a single layer or multiple layers including the above-described inorganic insulating material.

The sub-pixel circuit PC may include a plurality of transistors and a storage capacitor, as described above with reference to FIG. 4. In this regard, FIG. 6 illustrates the first thin-film transistor T1, the third thin-film transistor T3, and the storage capacitor Cst.

The first thin-film transistor T1 may include a semiconductor layer (hereinafter, referred to as a first semiconductor layer A1) on the buffer layer 201 and a gate electrode (hereinafter, referred to as a first gate electrode GE1) overlapping a channel region C1 of the first semiconductor layer A1. In an embodiment, the first semiconductor layer A1 may include a silicon-based semiconductor material, such as polysilicon. However, embodiments of the present disclosure are not necessarily limited thereto. The first semiconductor layer A1 may include the channel region C1, and a first region B1 and a second region D1 on opposite sides of the channel region C1. The first region B1 and the second region D1 may be regions including a higher concentration of impurities than the channel region C1, and any one of the first region B1 and the second region D1 may correspond to a source region and the other thereof may correspond to a drain region.

A first gate insulating layer 203 may be arranged between the first semiconductor layer A1 and the first gate electrode GE1. In an embodiment, the first gate insulating layer 203 may include an inorganic insulating material such as silicon oxide, silicon nitride, or silicon oxynitride, and may include a single layer or multiple layers including the above-described inorganic insulating material.

In an embodiment, the first gate electrode GE1 may include a conductive material including molybdenum (Mo), aluminum (Al), copper (Cu), titanium (Ti), or the like, and may include a single layer or multiple layers including the above-described material.

The storage capacitor Cst may include a lower electrode CE1 and an upper electrode CE2 overlapping each other. In an embodiment, the lower electrode CE1 of the storage capacitor Cst may include the first gate electrode GE1. For example, the first gate electrode GE1 may include the lower electrode CE1 of the storage capacitor Cst. For example, the first gate electrode GE1 and the lower electrode CE1 of the storage capacitor Cst may be integrally formed as a single body.

A first interlayer insulating layer 205 may be arranged between the lower electrode CE1 and the upper electrode CE2 of the storage capacitor Cst. In an embodiment, the first interlayer insulating layer 205 may include an inorganic insulating material such as silicon oxide, silicon nitride, or silicon oxynitride, and may include a single layer or multiple layers including the above-described inorganic insulating material.

In an embodiment, the upper electrode CE2 of the storage capacitor Cst may include a low-resistance conductive material such as Mo, Al, Cu, and/or Ti, and may include a single layer or multiple layers including the above-described material.

A second interlayer insulating layer 207 may be disposed on the storage capacitor Cst. In an embodiment, the second interlayer insulating layer 207 may include an inorganic insulating material such as silicon oxide, silicon nitride, or silicon oxynitride, and may include a single layer or multiple layers including the above-described inorganic insulating material.

A semiconductor layer (hereinafter, referred to as a third semiconductor layer A3) of the third thin-film transistor T3 may be disposed on (e.g., disposed directly thereon) the second interlayer insulating layer 207. The third semiconductor layer A3 may include an oxide-based semiconductor material. For example, the third semiconductor layer A3 may include a zinc (Zn) oxide-based material, for example, Zn oxide, indium (In)—Zn oxide, gallium (Ga)—In—Zn oxide, or the like. In some embodiments, the third semiconductor layer A3 may include an In—Ga—Zn—O (IGZO), In—Sn—Zn—O (ITZO), or In—Ga—Sn—Zn—O (IGTZO) semiconductor, in which metal such as In, Ga, or tin (Sn) is included in zinc oxide (ZnO).

The third semiconductor layer A3 may include a channel region C3, and a first region B3 and a second region D3 on opposite sides of the channel region C3. Any one of the first region B3 and the second region D3 may correspond to a source region and the other thereof may correspond to a drain region.

The third thin-film transistor T3 may include a gate electrode (hereinafter, referred to as a third gate electrode GE3) overlapping the channel region C3 of the third semiconductor layer A3. In an embodiment, the third gate electrode GE3 may have a double gate structure including a lower gate electrode G3A below the third semiconductor layer A3 and an upper gate electrode G3B above the channel region C3.

The lower gate electrode G3A may be arranged on the same layer (e.g., the first interlayer insulating layer 205) as the upper electrode CE2 of the storage capacitor Cst. In an embodiment, the lower gate electrode G3A may include the same material as that of the upper electrode CE2 of the storage capacitor Cst.

The upper gate electrode G3B may be disposed above the third semiconductor layer A3 with a second gate insulating layer 209 therebetween. In an embodiment, the second gate insulating layer 209 may include an inorganic insulating material such as silicon oxide, silicon nitride, or silicon oxynitride, and may include a single layer or multiple layers including the above-described inorganic insulating material.

A third interlayer insulating layer 210 may be disposed on the upper gate electrode G3B. The third interlayer insulating layer 210 may include an inorganic insulating material such as silicon oxynitride, and may include a single layer or multiple layers including the above-described inorganic insulating material.

Although FIG. 6 illustrates the first thin-film transistor T1 and the third thin-film transistor T3 among the plurality of thin-film transistors as described above with reference to FIG. 4 and illustrates that the first semiconductor layer A1 and the third semiconductor layer A3 are arranged on different layers, embodiments of the present disclosure are not necessarily limited thereto.

Each of the second, fifth, sixth, and seventh thin-film transistors T2, T5, T6, and T7 (see FIG. 4) described above with reference to FIG. 4 may have the same structure as that of the first thin-film transistor T1 described above with reference to FIG. 6. For example, in an embodiment each of the second, fifth, sixth, and seventh thin-film transistors T2, T5, T6, and T7 (see FIG. 4) may include a semiconductor layer on the same layer as the first semiconductor layer A1 of the first thin-film transistor T1 and a gate electrode on the same layer as the first gate electrode GE1 of the first thin-film transistor T1. The semiconductor layer of each of the second, fifth, sixth, and seventh thin-film transistors T2, T5, T6, and T7 (see FIG. 4) may be integrally connected to the first semiconductor layer A1.

The fourth thin-film transistor T4 described above with reference to FIG. 4 may have the same structure as that of the third thin-film transistor T3 described above with reference to FIG. 6. For example, the fourth thin-film transistor T4 may include a semiconductor layer on the same layer as the third semiconductor layer A3 of the third thin-film transistor T3 and a gate electrode on the same layer as the third gate electrode GE3 of the third thin-film transistor T3. The semiconductor layer of the fourth thin-film transistor T4 may be integrally connected to the third semiconductor layer A3 of the third thin-film transistor T3.

In an embodiment, the first thin-film transistor T1 and the third thin-film transistor T3 may be electrically connected to each other through a node connection line 166. The node connection line 166 may be disposed on (e.g., disposed directly thereon) the third interlayer insulating layer 210. One side of the node connection line 166 may be connected to the first gate electrode GE1 of the first thin-film transistor T1, and the other side of the node connection line 166 may be connected to the third semiconductor layer A3 of the third thin-film transistor T3.

In an embodiment, the node connection line 166 may include Al, Cu, and/or Ti, and may include a single layer or multiple layers including the above-described material. For example, the node connection line 166 may have a three-layer structure of Ti/Al/Ti.

A first organic insulating layer 211 may be disposed on the node connection line 166. The first organic insulating layer 211 may include an organic insulating material. For example, the organic insulating material may include benzocyclobutene (BCB), polyimide, or hexamethyldisiloxane (HMDSO). However, embodiments of the present disclosure are not necessarily limited thereto.

The data line DL and the driving voltage line PL may be disposed on (e.g., disposed directly thereon) the first organic insulating layer 211, and may be covered with a second organic insulating layer 213. In an embodiment, each of the data line DL and the driving voltage line PL may include Al, Cu, and/or Ti, and may include a single layer or multiple layers including the above-described material. For example, each of the data line DL and the driving voltage line PL may have a three-layer structure of Ti/Al/Ti.

In an embodiment, the second organic insulating layer 213 may include an organic insulating material such as acryl, BCB, polyimide, and/or HMDSO. Although FIG. 6 illustrates that the data line DL and the driving voltage line PL are formed on the first organic insulating layer 211, embodiments of the present disclosure are not necessarily limited thereto. For example, in an embodiment, any one of the data line DL and the driving voltage line PL may be arranged on the same layer as the node connection line 166.

A light-emitting diode, for example, the organic light-emitting diode OLED, may be disposed on the second organic insulating layer 213.

In an embodiment, a first electrode 221 of the organic light-emitting diode OLED may include a reflective film including silver (Ag), magnesium (Mg), Al, platinum (Pt), palladium (Pd), gold (Au), nickel (Ni), neodymium (Nd), iridium (Ir), chromium (Cr), or a compound thereof. However, embodiments of the present disclosure are not necessarily limited thereto. For example, in an embodiment, the first electrode 221 may further include a conductive oxide layer above and/or below the reflective film. The conductive oxide layer may include indium tin oxide (ITO), indium zinc oxide (IZO), ZnO, indium oxide ($In_2O_3$), indium gallium oxide (IGO), and/or aluminum zinc oxide (AZO). In an embodiment, the first electrode 221 may have a three-layer structure of ITO/Ag/ITO.

A bank layer 215 may be disposed on (e.g., disposed directly thereon) the first electrode 221. The bank layer 215 may include an opening overlapping the first electrode 221, and may cover an edge (e.g., lateral edges) of the first electrode 221. In an embodiment, the bank layer 215 may include an organic insulating material.

An intermediate layer 222 may include an emission layer 222b. The intermediate layer 222 may include a first functional layer 222a below the emission layer 222b and/or a second functional layer 222c above the emission layer 222b. The emission layer 222b may include a polymer organic material or a low-molecular weight organic material that emits light of a certain color. The second functional layer 222c may include an electron transport layer (ETL) and/or an electron injection layer (EIL). Each of the first functional layer 222a and the second functional layer 222c may include an organic material.

A second electrode 223 may include a conductive material having a low work function. For example, in an embodiment the second electrode 223 may include a (semi) transparent layer including Ag, Mg, Al, Pt, Pd, Au, Ni, Nd, Ir, Cr, lithium (Li), calcium (Ca), or an alloy thereof. Alternatively, the second electrode 223 may further include a layer such as ITO, IZO, ZnO, or $In_2O_3$ above the (semi) transparent layer including the above-described material.

The emission layer 222b may be disposed on the display area DA to overlap the first electrode 221 through the opening of the bank layer 215. In contrast, in an embodiment the first functional layer 222a, the second functional layer 222c, and the second electrode 223 may extend to be located in the middle area MA as well as the display area DA.

A spacer 217 may be disposed on (e.g., disposed directly thereon) the bank layer 215. In an embodiment, the spacer 217 and the bank layer 215 may be formed together in the same process, or may be individually formed in separate processes. In an embodiment, the spacer 217 may include an organic insulating material such as polyimide.

The organic light-emitting diode OLED may be covered with an encapsulation layer 300. The encapsulation layer 300 may include at least one organic encapsulation layer and at least one inorganic encapsulation layer. In an embodiment a shown in FIG. 6, the encapsulation layer 300 may include first and second inorganic encapsulation layers 310 and 330 and an organic encapsulation layer 320 therebetween. However, embodiments of the present disclosure are not necessarily limited thereto.

In an embodiment, each of the first inorganic encapsulation layer 310 and the second inorganic encapsulation layer 330 may include one or more inorganic materials among aluminum oxide, titanium oxide, tantalum oxide, hafnium oxide, zinc oxide, silicon oxide, silicon nitride, and silicon oxynitride. Each of the first inorganic encapsulation layer 310 and the second inorganic encapsulation layer 330 may include a single layer or multiple layers including the above-described material. The organic encapsulation layer 320 may include a polymer-based material. The polymer-based material may include acrylic resin, epoxy-based resin, polyimide, and polyethylene. In an embodiment, the organic encapsulation layer 320 may include acrylate.

The first inorganic encapsulation layer 310 and the second inorganic encapsulation layer 330 may have different thicknesses from each other. For example, in an embodiment the thickness of the first inorganic encapsulation layer 310 may be greater than the thickness of the second inorganic encapsulation layer 330. Alternatively, the thickness of the second inorganic encapsulation layer 330 may be greater than the thickness of the first inorganic encapsulation layer 310, or the first inorganic encapsulation layer 310 and the second inorganic encapsulation layer 330 may have the same thickness as each other.

In an embodiment, the display panel 10 may include the substrate 100, the image generating layer 20 on the substrate 100 and including a circuit-diode layer 200 and the encapsulation layer 300, the circuit-diode layer 200 including pixel circuits and light-emitting diodes, and the input sensing layer 40 on the image generating layer 20.

In an embodiment, the input sensing layer 40 may include a first touch insulating layer 401 on the second inorganic encapsulation layer 330, a first conductive layer 402 on the first touch insulating layer 401, a second touch insulating layer 403 on the first conductive layer 402, a second conductive layer 404 on the second touch insulating layer 403, and a third touch insulating layer 405 on the second conductive layer 404.

Each of the first touch insulating layer 401, the second touch insulating layer 403, and the third touch insulating layer 405 may include an inorganic insulating material and/or an organic insulating material. For example, in an embodiment, each of the first touch insulating layer 401 and the second touch insulating layer 403 may include an inorganic insulating material such as silicon oxide, silicon nitride, and/or silicon oxynitride, and the third touch insulating layer 405 may include an organic insulating material. However, embodiments of the present disclosure are not necessarily limited thereto.

A touch electrode TE of the input sensing layer 40 may include a structure in which the first conductive layer 402 and the second conductive layer 404 are connected to each other. Alternatively, the touch electrode TE may be formed on any one of the first conductive layer 402 and the second conductive layer 404, and may include a metal line provided in the corresponding conductive layer. Each of the first conductive layer 402 and the second conductive layer 404 may include Al, Cu, and/or Ti, and may include a single layer or multiple layers including the above-described material. For example, each of the first conductive layer 402 and the second conductive layer 404 may have a three-layer structure of Ti/Al/Ti.

Referring to the middle area MA of FIG. 6, the middle area MA may include a first sub-middle area SMA1 through which the detour portions DL-C1 and DL-C2 of the data lines DL described above with reference to FIG. 5 pass.

The detour portions DL-C1 and DL-C2 of the data lines DL may be arranged on different layers from each other. Any one of the detour portions DL-C1 and DL-C2 of the data lines DL adjacent to each other may be disposed on the third interlayer insulating layer 210, and the other thereof may be disposed on the first organic insulating layer 211.

When the detour portions DL-C1 and DL-C2 of the data lines DL are alternately arranged with an insulating layer (e.g., the first organic insulating layer 211) therebetween, a pitch $\Delta d$ between the detour portions DL-C1 and DL-C2 of the data lines DL may be reduced, and thus, the area in the middle area MA may be efficiently utilized.

Figure 7:
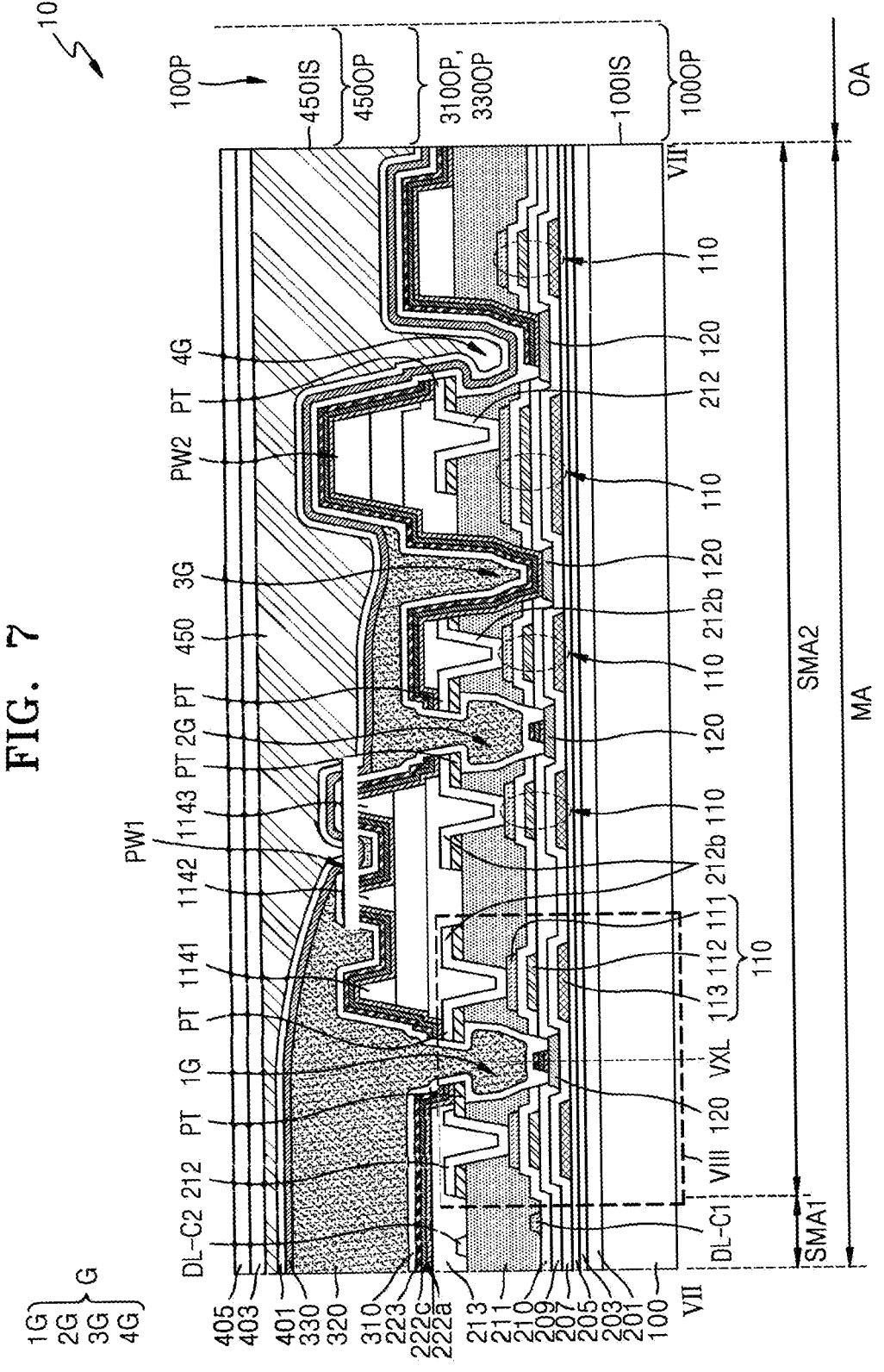
FIG. 7 is a cross-sectional view, taken along line VII-VII' of FIG. 5, illustrating a display panel according to an embodiment.
Figure 8:
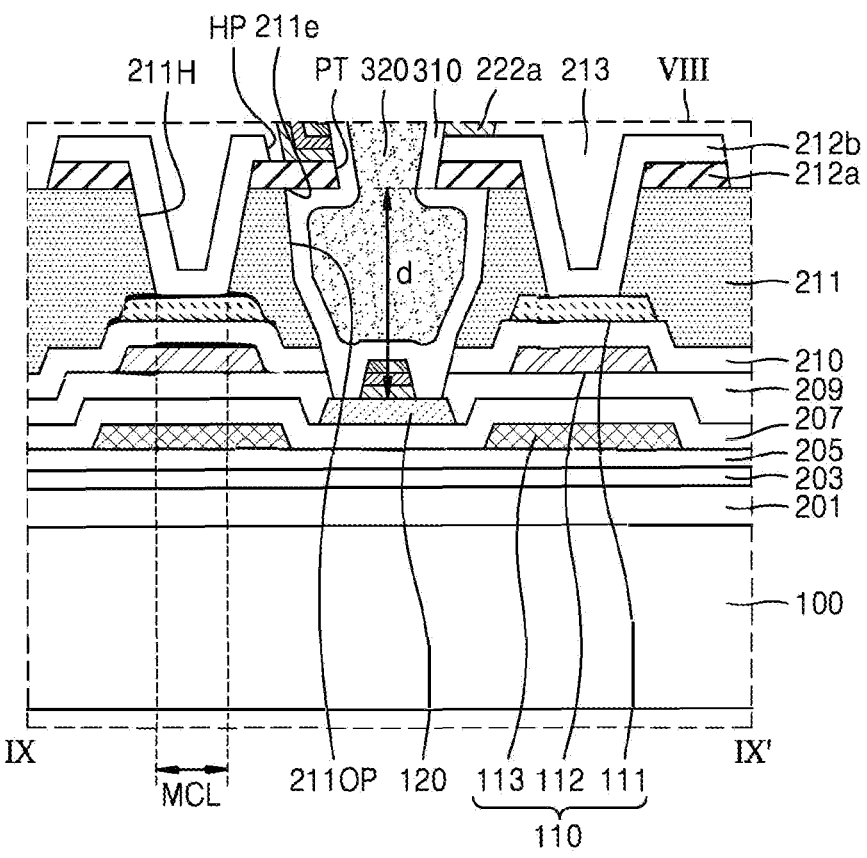
FIG. 8 is an enlarged cross-sectional view illustrating region VIII of FIG. 7 according to an embodiment.
Figure 9:
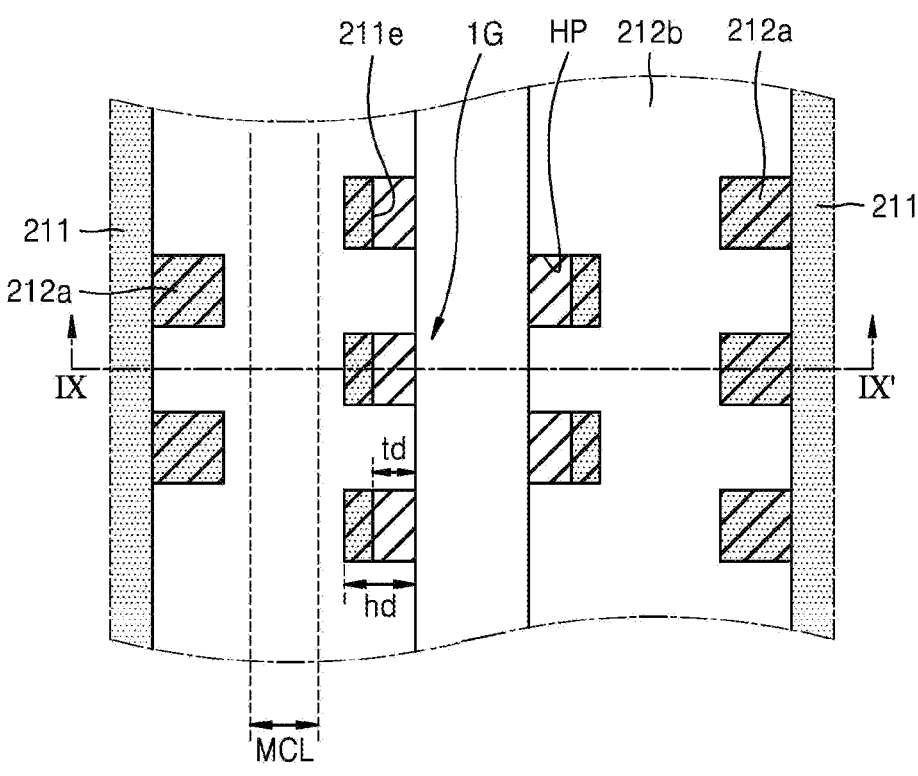
FIG. 9 is a plan view corresponding to FIG. 8 according to an embodiment.

FIG. 7 is a cross-sectional view illustrating the display panel 10 according to an embodiment, taken along line VII-VII' of FIG. 5. FIG. 8 is an enlarged cross-sectional view of region VIII of FIG. 7, illustrating the shape of the groove G. FIG. 9 is a plan view corresponding to FIG. 8.

Referring to FIGS. 6 and 7, the middle area MA may include the first sub-middle area SMA1 adjacent to the display area DA (see FIG. 6) and a second sub-middle area SMA2 adjacent to the opening area OA. In an embodiment, the detour portions DL-C1 and DL-C2 of the data lines DL described above with reference to FIG. 6 may be arranged in the first sub-middle area SMA1, and the detour portions DL-C1 and DL-C2 of the data lines DL illustrated in the first sub-middle area SMA1 of FIG. 7 may correspond to detour portions of some of the data lines described above with reference to FIG. 6.

The detour portions DL-C1 and DL-C2 of the data lines DL may be arranged in the first sub-middle area SMA1 of FIG. 7. The grooves G and partition walls may be arranged in the second sub-middle area SMA2. As shown in an embodiment of FIG. 7, the encapsulation layer 300 may extend to the middle area MA to cover the grooves G and the partition walls.

Referring to the second sub-middle area SMA2 of FIG. 7, the grooves G may be arranged to be spaced apart from each other. In this regard, FIG. 7 illustrates that first to fourth grooves 1G, 2G, 3G, and 4G are consecutively arranged in a direction from the first sub-middle area SMA1 towards the opening area OA. In an embodiment, each of the first to fourth grooves 1G, 2G, 3G, and 4G may have a closed loop shape surrounding the opening area OA in a plan view, as described above with reference to FIG. 5.

The groove G may pass through at least one insulating layer on the buffer layer 201. In an embodiment, the at least one insulating layer in which the groove G is formed may include the first organic insulating layer 211, and may further include an insulating layer(s) below the first organic insulating layer 211. In this regard, FIG. 7 illustrates that the first to fourth grooves 1G, 2G, 3G, and 4G are formed to extend through the second gate insulating layer 209, the third interlayer insulating layer 210, and the first organic insulating layer 211. In an embodiment, the grooves G, for example, the first to fourth grooves 1G, 2G, 3G, and 4G, may be formed by removing portions of the second gate insulating layer 209, the third interlayer insulating layer 210, and the first organic insulating layer 211 through etching.

A lower layer 120 may be disposed directly below the groove G. In an embodiment, the lower layer 120 may function as an etch stopper during an etching process for forming the groove G. Accordingly, a bottom surface of the groove G may be an upper surface of the lower layer 120. In this regard, FIG. 7 illustrates that the lower layer 120 is located below each of the first to fourth grooves 1G, 2G, 3G, and 4G, and a bottom surface of each of the first to fourth grooves 1G, 2G, 3G, and 4G is coplanar with the upper surface of the lower layer 120.

In an embodiment, the lower layer 120 may be disposed on (e.g., disposed directly thereon) the second interlayer insulating layer 207, and may be formed together with the third semiconductor layer A3 (see FIG. 6) described above with reference to FIG. 6 in the same process. In an embodiment, the lower layer 120 may include the same material as that of the third semiconductor layer A3, for example, an oxide-based semiconductor material. In an embodiment, similar to the groove G, the lower layer 120 may have a closed loop shape surrounding the opening area OA in a plan view.

In an embodiment in which the groove G is not formed directly on the substrate 100 but formed on at least one inorganic insulating layer as in an embodiment shown in FIG. 7, moisture that may be introduced through the substrate 100 may be blocked by the at least one inorganic insulating layer. In this regard, FIG. 7 illustrates a structure in which the groove G is formed on the buffer layer 201, the first gate insulating layer 203, and the first interlayer insulating layer 205, such that the buffer layer 201, the first gate insulating layer 203, and the first interlayer insulating layer 205 effectively block moisture that may be introduced through the substrate 100.

In an embodiment, at least one of the grooves G may include a tip PT. In an embodiment, as illustrated in FIG. 7, each of the first groove 1G, the second groove 2G, and the fourth groove 4G may include at least one tip PT. For example, the first groove 1G may have tips PT positioned on opposite sides with respect to a virtual vertical line passing through the center of the first groove 1G. In an embodiment, similar to the first groove 1G, the second groove 2G may also include a pair of tips PT. In contrast, in an embodiment the fourth groove 4G may include only one tip PT.

The groove G may include an opening 211OP (FIG. 8) of the first organic insulating layer 211 and the tip PT that overlap each other. In an embodiment, the tip PT may be provided in a transparent layer 212a disposed directly on the first organic insulating layer 211 and a metal pattern layer 212b on the transparent layer 212a.

The transparent layer 212a may include a material that transmits visible light. In an embodiment, the transparent layer 212a may include a transparent conductive oxide. For example, the transparent layer 212a may include ITO, ZnO, or indium IZO.

In addition, the transparent layer 212a may include a transparent oxide semiconductor material. For example, the transparent layer 212a may include IGZO, InZnO, GaZnO, AlZnO, InSnGaO, InSnZnO, InSnGaZnO, or the like. However, embodiments of the present disclosure are not necessarily limited thereto.

In an embodiment, the metal pattern layer 212b may include the same metal as that of the data line DL and/or the driving voltage line PL described above with reference to FIG. 6. In an embodiment, the metal pattern layer 212b may have a three-layer structure of Ti/Al/Ti.

The transparent layer 212a and the metal pattern layer 212b may be arranged on at least one side of the groove G. For example, in an embodiment the transparent layer 212a and the metal pattern layer 212b may be arranged on opposite sides of a virtual vertical line VXL passing through the center of the first groove 1G, and ends of each of the transparent layer 212a and the metal pattern layer 212b may protrude towards the center of the first groove 1G to form the tip PT. In an embodiment, the tip PT may be a type of eaves portion, and may pass through an inner surface of the first organic insulating layer 211 forming an inner surface of the first groove 1G and protrude toward the center of the first groove 1G.

Similarly, in an embodiment the transparent layer 212a and the metal pattern layer 212b may be arranged on opposite sides of the second groove 2G. Ends of each of the transparent layer 212a and the metal pattern layer 212b may protrude toward the center of the second groove 2G to form the tip PT.

In an embodiment, the fourth groove 4G may include only one tip PT. The tip PT may be located on one side of the fourth groove 4G, for example, a first side adjacent to a second partition wall PW2. The transparent layer 212a and the metal pattern layer 212b may be located on only one side of the fourth groove 4G, and the ends of the transparent layer 212a and the metal pattern layer 212b may pass through the first organic insulating layer 211 forming an inner surface of the fourth groove 4G and protrude toward the center of the fourth groove 4G to form the tip PT.

In an embodiment, some of the layers included in the organic light-emitting diode OLED, for example, the first and second functional layers 222a and 222c which are organic material layers, may be disconnected by the groove G including the tip PT. The second electrode 223 may also be disconnected or separated by the groove G including the tip PT.

In this regard, FIG. 7 illustrates that the first and second functional layers 222a and 222c and the second electrode 223 are disconnected and separated by the tips PT of the first groove 1G, the second groove 2G, and the fourth groove 4G. In contrast, as shown in an embodiment of FIG. 7, the first and second functional layers 222a and 222c and the second electrode 223 may be continuously formed without being disconnected by the third groove GO. In a comparative embodiment, moisture may move towards the display area DA (see FIG. 5) through a side surface of the opening 10OP of the display panel 10, and the moisture may move through continuously formed organic material layers, for example, the first and second functional layers 222a and 222c. However, as illustrated in an embodiment of FIG. 7, because the first and second functional layers 222a and 222c are disconnected by the groove G including the tip PT, the moisture may be prevented from moving toward the display area DA (see FIG. 5).

FIGS. 8 and 9 are views for describing the transparent layer 212*a* and the metal pattern layer 212*b* forming the tip PT of the groove G. FIG. 8 is an enlarged view of region VIII of FIG. 7, and FIG. 9 is a plan view corresponding to FIG. 8. FIG. 8 is a cross-sectional view taken along line IX-IX' of FIG. 9.

Referring to FIGS. 8 and 9, the metal pattern layer 212*b* forming the tip PT may include a groove portion HP corresponding to an edge of the tip PT. The groove portion HP may expose at least a portion of an upper surface of the transparent layer 212*a*.

In an embodiment, because the transparent layer 212*a* transmitting visible light is disposed below the metal pattern layer 212*b* forming the tip PT, a length td (FIG. 9) by which the tip PT protrudes from an upper surface of the first organic insulating layer 211 may be easily observed.

Since the metal pattern layer 212*b* is opaque to light and the tip PT has a very short length, it may be difficult to observe the length of the tip PT when only the metal pattern layer 212*b* is provided.

In an embodiment shown in FIGS. 8-9, by disposing the transparent layer 212*a* below the metal pattern layer 212*b* and forming the groove portion HP exposing at least a portion of the upper surface of the transparent layer 212*a* in the metal pattern layer 212*b*, an edge 211*e* of the opening 211OP of the first organic insulating layer 211 may be visible through the transparent layer 212*a*.

Accordingly, by measuring a distance between the edge 211*e* of the opening 211OP of the first organic insulating layer 211 and an edge of the metal pattern layer 212*b*, the length td by which the tip PT protrudes may be obtained.

In an embodiment, the groove portion HP may be recessed from the edge of the metal pattern layer 212*b* in a width direction of the metal pattern layer 212*b*, in a plan view. In some embodiments as shown in FIG. 9, the groove portion HP may have a quadrangular shape having a first side in the width direction of the metal pattern layer 212*b*. In an embodiment, a length hd of the first side of the groove portion HP may be greater than the length td by which the tip PT protrudes from the upper surface of the first organic insulating layer 211. In some embodiments, the length td by which the tip PT protrudes may be in a range of about 0.7 μm to about 1.5 μm. In some embodiments, the length hd of the first side of the groove portion HP may be in a range of about 1 μm to about 3 μm.

Although the drawings illustrate that the groove portion HP has a quadrangular shape, the shape of the groove portion HP is not necessarily limited thereto as long as the groove portion HP is recessed from the edge of the tip PT by a length greater than the length by which the tip PT protrudes.

In some embodiments, a plurality of groove portions HP may be provided and arranged at regular intervals along the edge of the tip PT. For example, the plurality of groove portions HP may be arranged to surround the opening area OA (see FIG. 5). Accordingly, the shape of the tip PT according to location may be measured.

In an embodiment, a metal dummy stack 110 may be arranged around the groove G. The metal dummy stacks 110 may be arranged on opposite sides of a virtual vertical line passing through the groove G. The metal dummy stack 110 may be a type of mound including metal layers overlapping each other with an insulating layer therebetween. A depth d of the groove G may be increased by disposing the metal dummy stack 110 around the groove G. In an embodiment, the depth d may be in a range of about 2.5 μm to about 3 μm. The metal dummy stack 110 may include first to third metal layers 111, 112, and 113.

In an embodiment, the metal pattern layer 212*b* may be in direct contact with the uppermost layer of the metal dummy stack 110, for example, the first metal layer 111. For example, as shown in an embodiment of FIG. 8, a lower portion of the metal pattern layer 212*b* may be in direct contact with an upper surface of the first metal layer 111 through a hole 211H of the first organic insulating layer 211. A metal contact area MCL formed by the direct contact between the metal pattern layer 212*b* and the metal dummy stack 110 may be arranged adjacent to each of the grooves G. Since the metal pattern layer 212*b* is arranged in the hole 211H of the first organic insulating layer 211, movement of moisture through the first organic insulating layer 211 may be blocked. In an embodiment, the transparent layer 212*a* may be arranged only on the upper surface of the first organic insulating layer 211 and may not be disposed in the hole 211H of the first organic insulating layer 211. Both the metal pattern layer 212*b* and the first metal layer 111 may include metal and have a relatively strong contact force.

In an embodiment, the first to third metal layers 111, 112, and 113 may be located on the same layer and include the same material as the electrodes of the transistors and the storage capacitor described above with reference to FIG. 6. For example, the first metal layer 111 may be located on the same layer and include the same material as the node connection line 166 (see FIG. 6). The second metal layer 112 may be located on the same layer and include the same material as the upper gate electrode G3B, which is a sub-layer of the third gate electrode GE3. The third metal layer 113 may be located on the same layer and include the same material as the upper electrode CE2 of the storage capacitor Cst and/or the lower gate electrode G3A, which is a sub-layer of the third gate electrode GE3. Although FIG. 7 illustrates that the metal dummy stack 110 includes the three metal layers overlapping each other with the insulating layer therebetween, embodiments of the present disclosure are not necessarily limited thereto. For example, in some embodiments, the number of metal layers of the metal dummy stack 110 may be less than or greater than three.

Although FIGS. 8 and 9 have been described with reference to the first groove 1G, the above-described structure may be applied to the second groove 2G and the fourth groove 4G, which are grooves having the tip PT. Therefore, a repeated description of similar or identical elements will be omitted for economy of description.

Some of the grooves G, for example, the third groove 3G, may not include the tip PT. In an embodiment, the third groove 3G may be used to monitor the organic encapsulation layer 320 of the encapsulation layer 300.

The organic encapsulation layer 320 may be formed by applying and curing a monomer. Since the monomer has fluidity, effectively controlling the location of the monomer is desired in the manufacturing of the display panel 10. The location of the organic encapsulation layer 320 may be measured by using the amount of light reflected after being irradiated onto the display panel 10. Since the tip PT including metal affects the reflectance of light used to monitor the organic encapsulation layer 320, it may be difficult to track the location of the organic encapsulation layer 320 when all of the grooves G include the tip PT. However, since the third groove 3G of the display panel 10 according to an embodiment does not have the tip PT and/or the fourth groove 4G has the tip PT only on one side thereof, the above-described issues may be prevented or reduced.

In addition to the grooves G, partition walls may be located in the middle area MA. In this regard, FIG. 7 illustrates a first partition wall PW1 and the second partition wall PW2. The grooves G may be arranged to be spaced apart from each other in the second sub-middle area SMA2. The first groove 1G may be arranged between the first partition wall PW1 and the first sub-middle area SMA1. For example, the first groove 1G may be arranged between the first partition wall PW1 and the display area DA (see FIG. 5). The second groove 2G and the third groove 3G may be arranged between the first partition wall PW1 and the second partition wall PW2. The fourth groove 4G may be arranged between the second partition wall PW2 and the opening area OA.

The grooves G between the first partition wall PW1 and the second partition wall PW2 may be covered with the organic encapsulation layer 320. In this regard, FIG. 7 illustrates that the second groove 2G and the third groove 3G are covered with the organic encapsulation layer 320 in an area between the first partition wall PW1 and the second partition wall PW2. In a comparative embodiment in which grooves between the first partition wall PW1 and the second partition wall PW2, for example, the second groove 2G and the third groove 3G, are not covered with the organic encapsulation layer 320, inorganic insulating layers such as the first inorganic encapsulation layer 310 and the second inorganic encapsulation layer 330 may be in direct contact with each other on the second groove 2G and the third groove 3G. When the area of a contact area between the first inorganic encapsulation layer 310 and the second inorganic encapsulation layer 330 on the second groove 2G and the third groove 3G is relatively large, cracks may easily occur in contact portions between the first inorganic encapsulation layer 310 and the second inorganic encapsulation layer 330 due to the uneven structures of the second groove 2G and the third groove 3G themselves. The cracks may deteriorate the quality of the display panel 10. However, in an embodiment of the present embodiment, since the organic encapsulation layer 320 covers the grooves G between the first partition wall PW1 and the second partition wall PW2, for example, the second groove 2G and the third groove 3G, the above-described issues may be prevented or reduced.

In an embodiment, the first inorganic encapsulation layer 310 of the encapsulation layer 300 may continuously cover (e.g., conformally cover) inner surfaces of the grooves G, and the organic encapsulation layer 320 may cover the first sub-middle area SMA1 and a portion of the second sub-middle area SMA2. The organic encapsulation layer 320 may cover some of the grooves G. For example, as shown in an embodiment of FIG. 7 the first groove 1G and the second and third grooves 2G and 3G may be covered by the organic encapsulation layer 320 between the first partition wall PW1 and the second partition wall PW2. The second inorganic encapsulation layer 330 may entirely cover the middle area MA on the organic encapsulation layer 320.

In an embodiment, the first partition wall PW1 may include a plurality of protrusions to control the flow of the monomer when the organic encapsulation layer 320 is formed. In an embodiment, FIG. 7 illustrates that the first partition wall PW1 includes first to third protrusions 1141, 1142, and 1143 that are spaced apart from each other. However, embodiments of the present disclosure are not necessarily limited thereto and the number of the protrusions may vary.

In an embodiment, the organic encapsulation layer 320 may be discontinuous in the middle area MA due to the structure of the first partition wall PW1. For example, as illustrated in FIGS. 6 and 7, a first portion of the organic encapsulation layer 320 may cover the display area DA and the first sub-middle area SMA1, and a second portion thereof that is spaced apart and discontinuous with the first portion may cover the area between the first partition wall PW1 and the second partition wall PW2. In an embodiment, a portion of the second inorganic encapsulation layer 330 on the third protrusion 1143 of the first partition wall PW1, which is a discontinuous point of the organic encapsulation layer 320, may be in direct contact with a portion of the first inorganic encapsulation layer 310.

An end of the organic encapsulation layer 320 may be located on one side of the second partition wall PW2, and may not extend towards the opening area OA through the second partition wall PW2. Accordingly, a portion of the second inorganic encapsulation layer 330 may be in direct contact with a portion of the first inorganic encapsulation layer 310 on an upper surface of the second partition wall PW2. In addition, the second inorganic encapsulation layer 330 may be in direct contact with the first inorganic encapsulation layer 310 between the second partition wall PW2 and the opening area OA.

The touch insulating layers described above with reference to FIG. 6 may extend to the middle area MA. In this regard, FIG. 7 illustrates a structure in which the first to third touch insulating layers 401, 403, and 405 extend to the middle area MA.

A planarization layer 450 may be located in the middle area MA. The planarization layer 450 may planarize the middle area MA. The planarization layer 450 may cover a structure that is located in the middle area MA and provided below the planarization layer 450. For example, in an embodiment the planarization layer 450 may be disposed directly between the first and second touch insulating layers. However, embodiments of the present disclosure are not necessarily limited thereto.

Referring to FIGS. 6 and 7, the planarization layer 450 may be located only in the middle area MA and not present in the display area DA (see FIG. 6). In this regard, FIG. 6 illustrates that an outer edge 450e of the planarization layer 450 is not located in the display area DA. In an embodiment, a process of forming the planarization layer 450 may be performed between a process of forming the first touch insulating layer 401 and a process of forming the second touch insulating layer 403. Accordingly, the first touch insulating layer 401 and the second touch insulating layer 403 may be in direct contact with each other in the display area DA adjacent to the outer edge 450e of the planarization layer 450.

Referring to the opening area OA of FIG. 7, the display panel 10 may include the opening 10OP. The opening 10OP of the display panel 10 may include openings of elements constituting the display panel 10. For example, the opening 10OP of the display panel 10 may include an opening 100OP of the substrate 100, openings 310OP and 330OP of the first and second inorganic encapsulation layers 310 and 330 of the encapsulation layer 300, and an opening 450OP of the planarization layer 450.

In an embodiment, the openings of the elements constituting the display panel 10 may be formed at the same time. Accordingly, an inner surface 100IS of the substrate 100 defining the opening 100OP of the substrate 100 and an inner surface 450IS of the planarization layer 450 defining the opening 450OP of the planarization layer 450 may be located on the same vertical line.

FIGS. 10A to 10G are cross-sectional views sequentially illustrating some operations of a manufacturing method according to an embodiment. In detail, FIGS. 10A to 10G illustrate a method of forming a groove according to embodiments of the present disclosure.

Figure 10A:
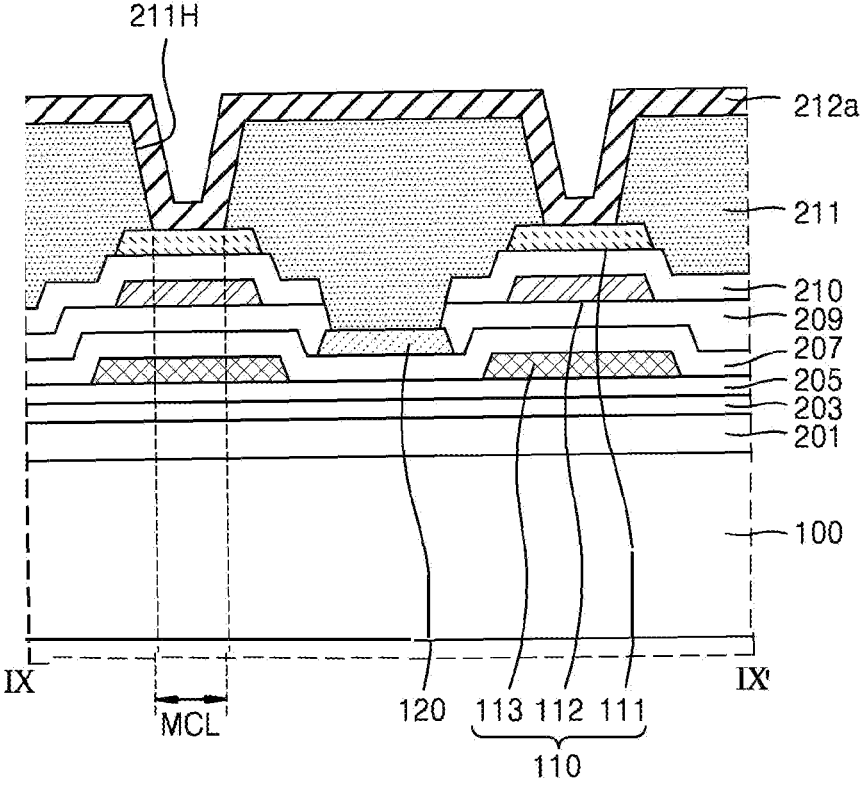
FIGS. 10A to 10G are cross-sectional views sequentially illustrating some operations of a manufacturing method according to some embodiments.

Referring to FIG. 10A, a pre-transparent layer 212a' is formed on the upper surface of the first organic insulating layer 211 having the hole 211H corresponding to the metal dummy stack 110. In an embodiment, the pre-transparent layer 212a' may include a transparent conductive oxide or a transparent oxide semiconductor material as a light-transmitting material. The pre-transparent layer 212a' may be formed by various deposition methods.

Figure 10B:
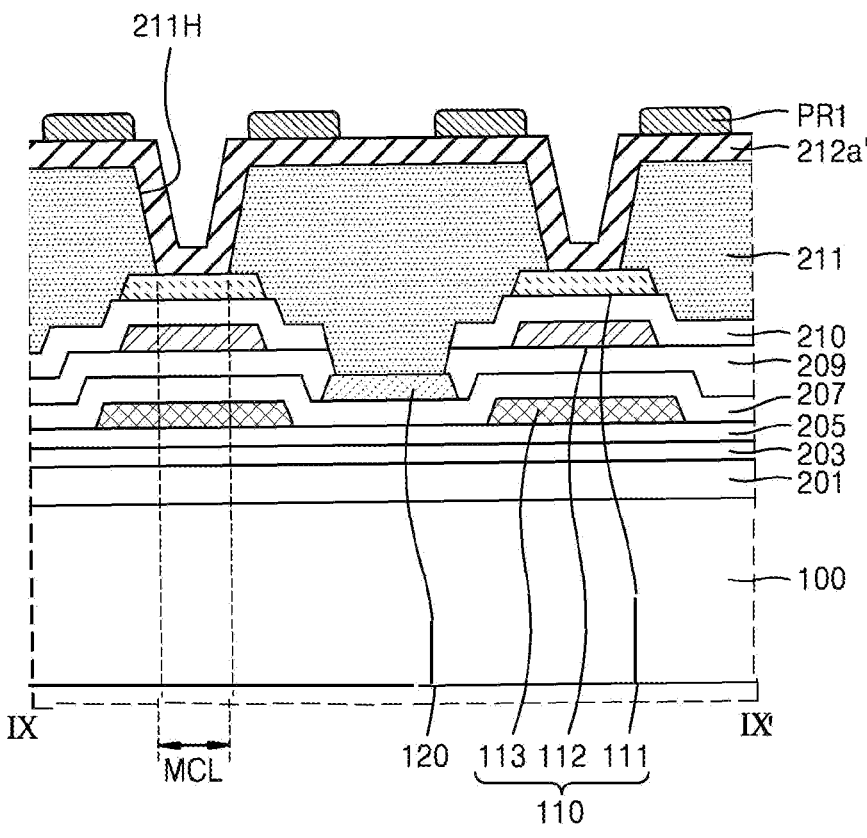

Referring to FIG. 10B, a first photoresist pattern PR1 is then formed on (e.g., formed directly thereon) the pre-transparent layer 212a'. In an embodiment, the first photoresist pattern PR1 may be formed through an exposure and development process using a mask.

Figure 10C:
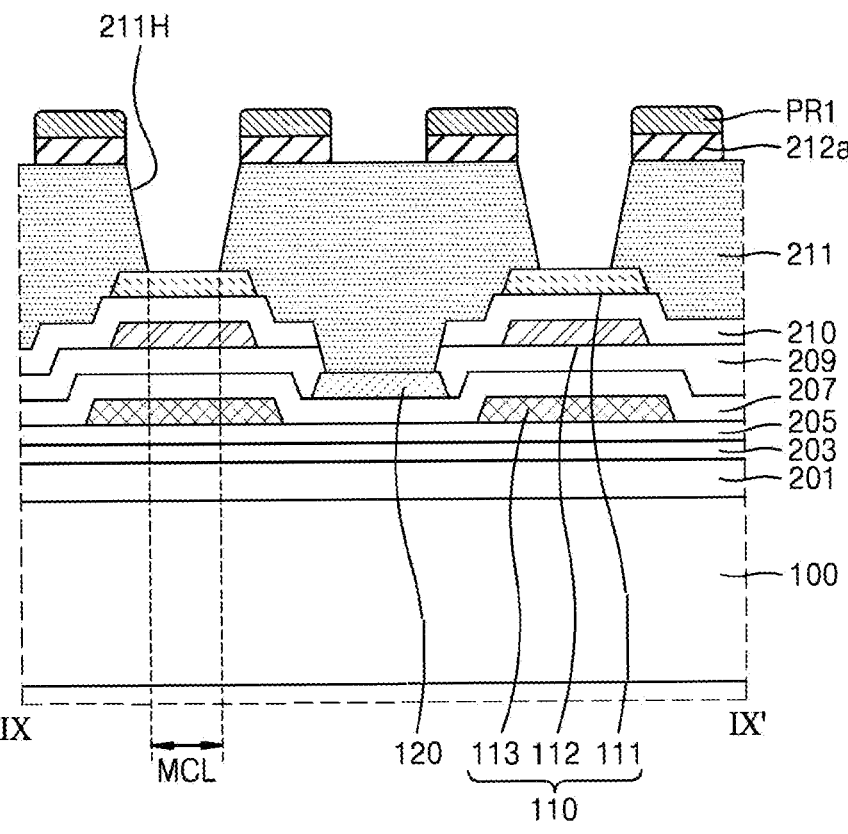

Referring to FIG. 10C, the pre-transparent layer 212a' is then etched to form the transparent layer 212a. In an embodiment, the pre-transparent layer 212a' may be etched by dry etching, wet etching, or a combination thereof. The transparent layer 212a may not be formed inside the hole 211H of the first organic insulating layer 211.

Figure 10D:
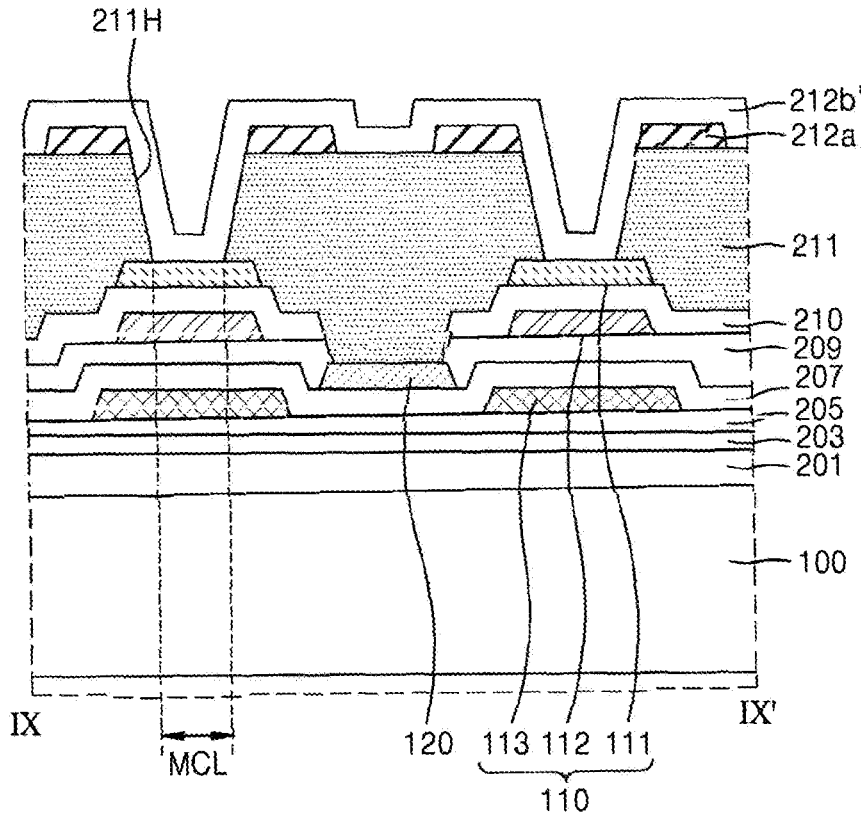

Referring to FIG. 10D, a pre-metal pattern layer 212b' is then formed on the upper surface of the first organic insulating layer 211 to cover the transparent layer 212a. In an embodiment, the pre-metal pattern layer 212b' may include a conductive material including Mo, Al, Cu, Ti, or the like, and may include a single layer or multiple layers including the above-described material.

The pre-metal pattern layer 212b' may be inserted into the hole 211H of the first organic insulating layer 211 to be in direct contact with the upper surface of the first metal layer 111 of the metal dummy stack 110.

Figure 10E:
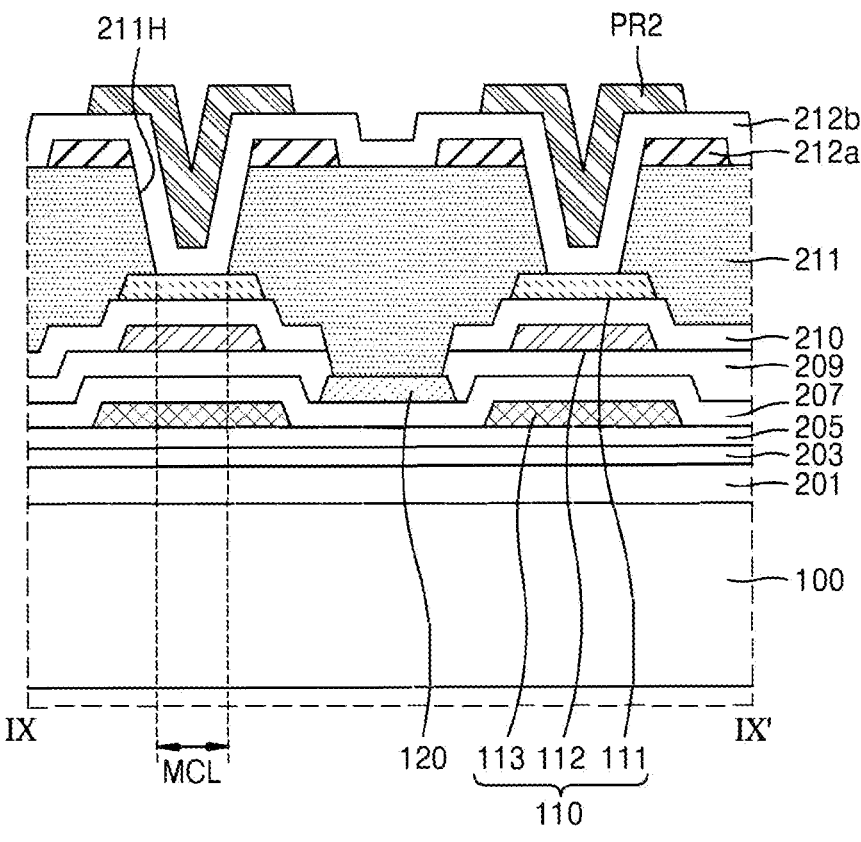

Referring to FIG. 10E, a second photoresist pattern PR2 is then formed on (e.g., formed directly thereon) the pre-metal pattern layer 212b'. In an embodiment, the second photoresist pattern PR2 may be formed through an exposure and development process using a mask.

Figure 10F:
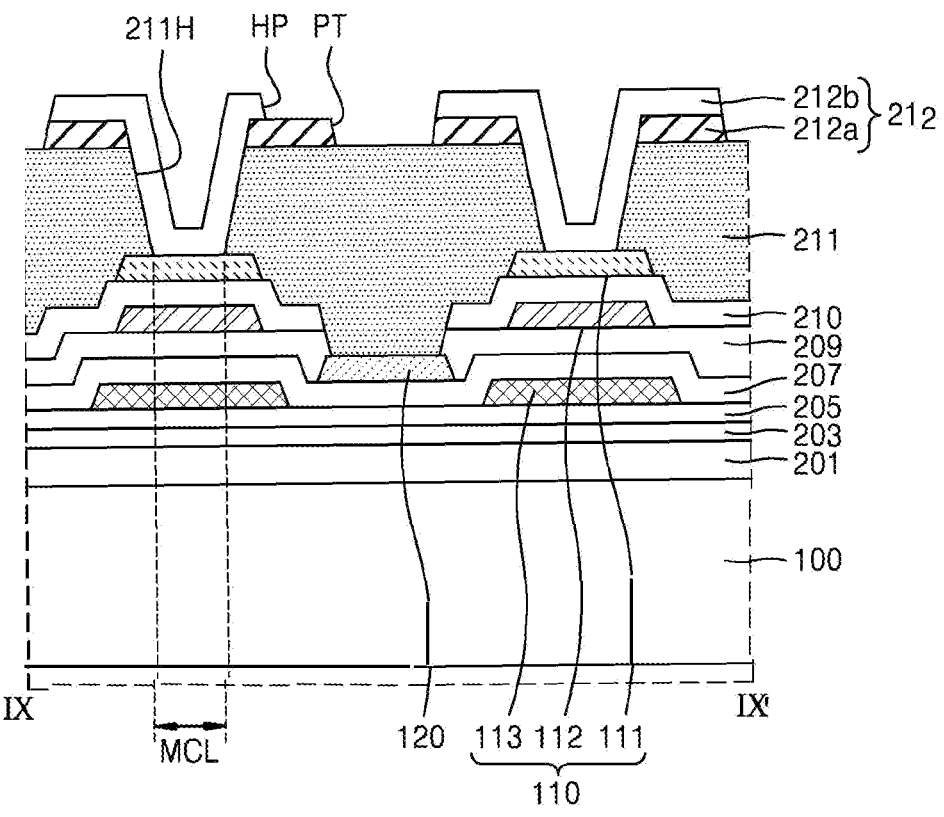

Referring to FIG. 10F, the pre-metal pattern layer 212b' is then etched to form the metal pattern layer 212b. In an embodiment, the pre-metal pattern layer 212b' may be etched by dry etching, wet etching, or a combination thereof. The metal pattern layer 212b may include the groove portion HP through which a portion of the transparent layer 212a below the metal pattern layer 212b is exposed. The second photoresist pattern PR2 may then be removed.

Figure 10G:
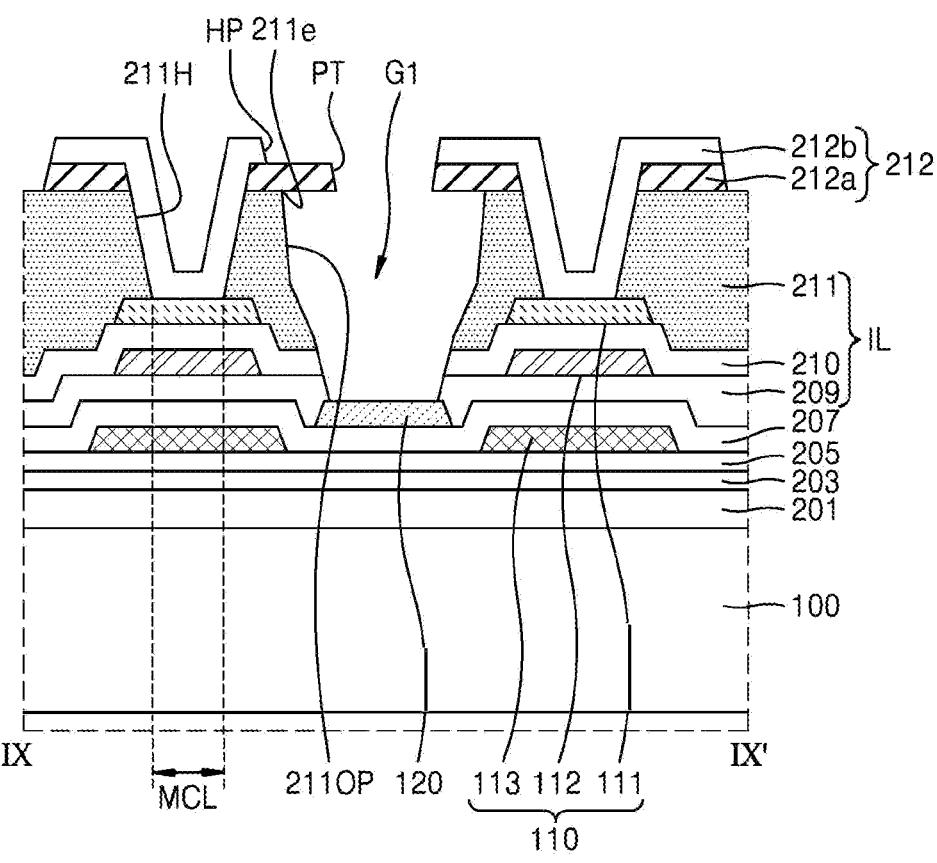

Referring to FIG. 10G, the opening 211OP corresponding to the lower layer 120 may be formed in the first organic insulating layer 211, thereby completing the first groove 1G. The first groove 1G may be formed through an insulating layer stack IL including the second gate insulating layer 209, the third interlayer insulating layer 210, and the first organic insulating layer 211. In an embodiment, the first groove 1G may be formed by etching portions of the first organic insulating layer 211, the third interlayer insulating layer 210, and the second gate insulating layer 209. In this embodiment, the lower layer 120 may serve as an etch stopper. The bottom surface of the first groove 1G may correspond to the upper surface of the lower layer 120.

In forming the opening 211OP of the first organic insulating layer 211, the etching amount may be adjusted such that the ends of the transparent layer 212a and the metal pattern layer 212b protrude toward the center of the opening 211OP, thereby forming the tip PT.

The tip PT may be one end of the transparent layer 212a and the metal pattern layer 212b directly on the first organic insulating layer 211, and may protrude toward the center of the corresponding groove.

In an embodiment, since the groove portion HP exposing the upper surface of the transparent layer 212a is arranged at the edge of the metal pattern layer 212b, the edge 211e of the opening 211OP of the first organic insulating layer 211 that is visible through the transparent layer 212a may be visible. Accordingly, it may be confirmed whether the tip PT has been formed to an appropriate length.

In the display panel according to one or more embodiments, external impurities such as moisture may be prevented from damaging display elements around an opening, and issues such as generation of cracks in a middle area around the opening may be resolved. However, the above effects are not limited thereto.

It should be understood that the embodiments described herein should be considered in a descriptive sense only and not for purposes of limitation. Descriptions of features or aspects within each embodiment should typically be considered as available for other similar features or aspects in other embodiments. While one or more non-limiting embodiments have been described with reference to the figures, it will be understood by those of ordinary skill in the art that various changes in form and details may be made therein without departing from the spirit and scope of the present disclosure.

What is claimed is:

1. A display panel comprising:
a substrate comprising an opening;
a plurality of light-emitting diodes arranged in a display area surrounding the opening; and
a plurality of grooves located in a middle area between the opening and the display area and disposed on at least one inorganic insulating layer on the substrate,
wherein at least one groove of the plurality of grooves includes a tip protruding towards a center of the at least one groove,
the tip comprises a transparent layer and a metal pattern layer disposed on the transparent layer, and
the metal pattern layer comprises a groove portion corresponding to an edge of the tip, the groove portion exposes at least a portion of an upper surface of the transparent layer.

2. The display panel of claim 1, wherein the groove portion has a quadrangular shape in a plan view.

3. The display panel of claim 1, wherein:
the metal pattern layer includes a plurality of groove portions; and
the plurality of groove portions are arranged at regular intervals along the edge of the tip.

4. The display panel of claim 1, wherein:
the tip overlaps an opening of an organic insulating layer; and
an edge of the opening of the organic insulating layer is visible through the groove portion.

5. The display panel of claim 1, wherein:
the display panel includes a lower layer comprising an oxide-based semiconductor material; and
a bottom surface of the at least one groove is an upper surface of the lower layer.

6. The display panel of claim 1, wherein the transparent layer comprises an oxide-based semiconductor material.

7. The display panel of claim 1, wherein:

a metal dummy stack is arranged around the at least one groove; and the metal pattern layer is disposed on an organic insulating layer and is in direct contact with the metal dummy stack through a hole included in the organic insulating layer.

8. The display panel of claim 7, wherein the metal dummy stack comprises a plurality of metal layers that are stacked with at least one insulating layer therebetween.

9. The display panel of claim 1, wherein:

each of the plurality of light-emitting diodes is connected to a sub-pixel circuit unit disposed on the substrate; and the sub-pixel circuit unit comprises a first thin-film transistor comprising a silicon-based semiconductor layer and a second thin-film transistor comprising an oxide-based semiconductor layer.

10. The display panel of claim 1, wherein each of the plurality of light-emitting diodes comprises:

an emission layer between a first electrode and a second electrode; and a functional layer between the first electrode and the second electrode, wherein the functional layer and the second electrode are disconnected by the tip of the at least one groove in the middle area.

11. A display panel comprising:

a substrate comprising an opening;

a plurality of light-emitting diodes arranged in a display area surrounding the opening;

an encapsulation layer disposed on the plurality of light-emitting diodes, the encapsulation layer comprising an organic encapsulation layer, a first inorganic encapsulation layer below the organic encapsulation layer, and a second inorganic encapsulation layer above the organic encapsulation layer;

a plurality of grooves located in a middle area between the opening and the display area and disposed on at least one inorganic insulating layer on the substrate; and a plurality of lower layers arranged in the middle area and respectively disposed below the plurality of grooves, wherein at least one groove of the plurality of grooves includes a tip protruding towards a center of the at least one groove, the tip comprises a transparent layer and a metal pattern layer disposed on the transparent layer, and the metal pattern layer comprises a groove portion corresponding to an edge of the tip, the groove portion exposes at least a portion of an upper surface of the transparent layer.

12. The display panel of claim 11, wherein:

each of the plurality of light-emitting diodes is connected to a sub-pixel circuit unit disposed on the substrate; and the sub-pixel circuit unit comprises a first thin-film transistor comprising a silicon-based semiconductor layer and a second thin-film transistor comprising an oxide-based semiconductor layer.

13. The display panel of claim 12, wherein each of the plurality of lower layers comprises a same material as a material of the oxide-based semiconductor layer.

14. The display panel of claim 11, further comprising a first partition wall and a second partition wall located in the middle area and spaced apart from each other in a direction from the display area towards the opening.

15. The display panel of claim 14, wherein at least one groove of the plurality of grooves is located between the first partition wall and the second partition wall.

16. The display panel of claim 11, wherein the groove portion has a quadrangular shape in a plan view.

17. The display panel of claim 11, wherein:

the metal pattern layer includes a plurality of groove portions; and the plurality of groove portions are arranged at regular intervals along the edge of the tip.

18. The display panel of claim 11, wherein:

the tip overlaps an opening of an organic insulating layer; and an edge of the opening of the organic insulating layer is visible through the groove portion.

19. The display panel of claim 11, wherein the transparent layer comprises an oxide-based semiconductor material.

20. The display panel of claim 11, wherein:

a metal dummy stack is arranged around the at least one groove; and the metal pattern layer is disposed on an organic insulating layer and is in direct contact with the metal dummy stack through a hole included in the organic insulating layer.

* * * * *